US012143207B2

(12) United States Patent
Nakano et al.

(10) Patent No.: US 12,143,207 B2
(45) Date of Patent: Nov. 12, 2024

(54) TECHNIQUE TO MAINTAIN FORMATION OF A PARALLEL TRANSMISSION LINE IN SPATIAL MULTIPLEX TRANSMISSION

(71) Applicant: NIPPON TELEGRAPH AND TELEPHONE CORPORATION, Tokyo (JP)

(72) Inventors: Marina Nakano, Musashino (JP); Yosuke Fujino, Musashino (JP); Hiroyuki Fukumoto, Musashino (JP); Kazunori Akabane, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 326 days.

(21) Appl. No.: 17/762,651

(22) PCT Filed: Sep. 27, 2019

(86) PCT No.: PCT/JP2019/038201
§ 371 (c)(1),
(2) Date: Mar. 22, 2022

(87) PCT Pub. No.: WO2021/059498
PCT Pub. Date: Apr. 1, 2021

(65) Prior Publication Data
US 2022/0353009 A1 Nov. 3, 2022

(51) Int. Cl.
*H04L 1/00* (2006.01)
*H04B 7/0413* (2017.01)

(52) U.S. Cl.
CPC ......... *H04L 1/0003* (2013.01); *H04B 7/0413* (2013.01); *H04L 1/0071* (2013.01)

(58) Field of Classification Search
CPC .... H04L 1/0003; H04L 1/0071; H04B 7/0413
See application file for complete search history.

(56) References Cited

U.S. PATENT DOCUMENTS

2019/0052336 A1* 2/2019 Cai ...................... H04B 7/0691
2022/0321182 A1* 10/2022 Nakano ............. H04W 28/0242

OTHER PUBLICATIONS

Tsuguo Maru et al., "Line-of-Sight MIMO Transmission for Achieving High Capacity Fixed Point Microwave Radio Systems", WCNC2008, IEEE, 2008, pp. 1137-1142.
(Continued)

*Primary Examiner* — Won Tae C Kim
(74) *Attorney, Agent, or Firm* — Harness, Dickey & Pierce, P.L.C.

(57) ABSTRACT

A radio transmission apparatus includes a communication distance measurement unit configured to measure a distance between a plurality of transmission antennas and a plurality of reception antennas, a selection unit configured to select a modulation scheme common to all frequency channels, the modulation scheme satisfying an average value of index values for each of the frequency channels according to a measured distance and satisfying a predetermined desired bit error rate, a transmission signal generation unit configured to separate transmission data, modulate each item of the separated transmission data by the selected common modulation scheme, and output the transmission signals multiplexed by the number of multiplexing indicating the number of the plurality of transmission antennas to be used. A radio reception apparatus includes a demodulation unit configured to demodulate a reception signal by a demodulation scheme corresponding to the modulation scheme to generate reception data.

4 Claims, 16 Drawing Sheets

(56) References Cited

OTHER PUBLICATIONS

Toshihisa Yamada et al., "A Consideration on Performance Evaluation of Linear/Rectangular Array LOS-MIMO Systems", IEICE Technical Report, CS2015-55, (Nov. 2015), pp. 59-64.

* cited by examiner

121. TRANSMISSION SCHEME LOOKUP TABLE 121-1 TRANSMISSION SCHEME LOOKUP TABLE

| DISTANCE [m] | 10 | TRANSMISSION SCHEME A "HIGHEST TRANSMISSION RATE" | TRANSMISSION SCHEME B "HIGH TRANSMISSION RATE" | TRANSMISSION SCHEME C "MEDIUM TRANSMISSION RATE" | TRANSMISSION SCHEME D "LOW TRANSMISSION RATE" |
|---|---|---|---|---|---|
| | ANGLE [DEGREE] | | | | |
| | 30 | | | | |
| $f_0$ [Hz] | | Poor | Poor | Fair | Fair |
| $f_1$ [Hz] | | Poor | Fair | Good | Good |
| $f_2$ [Hz] | | Fair | Good | Good | Good |
| $f_3$ [Hz] | | Fair | Fair | Good | Good |
| $f_4$ [Hz] | | Poor | Poor | Fair | Good |
| $f_5$ [Hz] | | Poor | Poor | Fair | Good |

Fig. 2

122: CHANNEL CAPACITY TABLE

| | $x_1$ [m] | $x_2$ [m] | $x_3$ [m] | $x_4$ [m] |
|---|---|---|---|---|
| $f_0$ [Hz] | 10.5 [bps/Hz] | 9.5 [bps/Hz] | 7.0 [bps/Hz] | 8.5 [bps/Hz] |
| $f_1$ [Hz] | 9.0 [bps/Hz] | 7.0 [bps/Hz] | 9.0 [bps/Hz] | 11.0 [bps/Hz] |
| $f_2$ [Hz] | 7.5 [bps/Hz] | 9.0 [bps/Hz] | 10.0 [bps/Hz] | 9.0 [bps/Hz] |
| $f_3$ [Hz] | 9.5 [bps/Hz] | 11.0 [bps/Hz] | 9.0 [bps/Hz] | 7.5 [bps/Hz] |
| $f_4$ [Hz] | 11.0 [bps/Hz] | 9.0 [bps/Hz] | 9.5 [bps/Hz] | 7.0 [bps/Hz] |
| $f_5$ [Hz] | 10.0 [bps/Hz] | 9.5 [bps/Hz] | 7.5 [bps/Hz] | 8.5 [bps/Hz] |
| AVERAGE CH CAPACITY | 9.6 [bps/Hz] | 9.2 [bps/Hz] | 8.7 [bps/Hz] | 8.6 [bps/Hz] |
| MAXIMUM GUARANTEED TRANSMISSION SCHEME | TRANSMISSION SCHEME A "HIGHEST TRANSMISSION RATE" | TRANSMISSION SCHEME B "HIGH TRANSMISSION RATE" | TRANSMISSION SCHEME B "HIGH TRANSMISSION RATE" | TRANSMISSION SCHEME C "MEDIUM TRANSMISSION RATE" |

Fig. 11

TECHNIQUE TO MAINTAIN FORMATION OF A PARALLEL TRANSMISSION LINE IN SPATIAL MULTIPLEX TRANSMISSION

CROSS-REFERENCE TO RELATED APPLICATIONS

This application is a 371 U.S. National Phase of International Application No. PCT/JP2019/038201 filed on Sep. 27, 2019. The entire disclosure of the above application is incorporated herein by reference.

TECHNICAL FIELD

The present invention relates to a radio communication system and a radio communication method.

BACKGROUND ART

In recent years, a spatial multiplexing technology is often used to increase a communication capacity. In an environment with a multipath, for example, it is possible to form a parallel transmission line by using a multiple input multiple output (MIMO) technology in consideration of multipath waves to achieve spatial multiplexing. On the other hand, in communicating with ultra-short waves such as millimeter waves, it is difficult to use the multipath waves, and thus, a line of sight multiple input multiple output (LoS-MIMO) technology for performing spatial multiplexing in a line-of-sight environment is used (see, for example, NPDs 1 and 2).

In a general MIMO, a communication in a non line-of-sight environment is assumed, and the parallel transmission line is realized by a multipath including reflected waves generated by an obstacle to increase a transmission capacity. In the line-of-sight environment, an effect of increasing the transmission capacity of the MIMO is lost. On the other hand, in the LoS-MIMO, an orthogonal parallel transmission line is formed so that a distance between transmission and reception antennas, a transmission antenna spacing, and a reception antenna spacing satisfy a certain geometric condition. As a result, it is possible to realize a high channel capacity by spatial multiplex transmission even in the line-of-sight environment.

For example, as illustrated in FIG. 16, it is assumed that two transmission antennas 304-1 and 304-2 and two reception antennas 401-1 and 401-2 are installed in a line-of-sight environment. In this case, in a distance D between the transmission and reception antennas, a distance d between the transmission antennas 304-1 and 304-2, a distance d between the reception antennas 401-1 and 401-2, the following Equation (1) is assumed to be established.

[Math. 1]
$$d = \sqrt{\frac{\lambda R}{2}} \quad (1)$$

In Equation (1), "λ" is a wavelength of a radio signal. If the relationship of the Equation (1) is established, for example, a path length difference between two radio signals reaching the one reception antenna 401-1 from the two transmission antennas 304-1 and 304-2 is ¼ of the wavelength λ, and the transmission lines are orthogonal to each other, and thus, it is possible to form a parallel transmission line.

FIG. 17 is a block diagram illustrating an example of a configuration of a radio communication system 500 using the LoS-MIMO technology. The LoS-MIMO is often used for communication and the like between locations where millimeter waves are used. Thus, before data is transmitted, a transmission signal generation unit 301 included in a radio transmission apparatus 300 selects a coding rate, the number of multiplexing, and a multi-level number. Furthermore, in general, the same coding rate, multi-level number, and number of multiplexing are used in the LoS-MIMO.

CITATION LIST

Non Patent Document

NPD 1: T. Maru, M. Kawai, E. Sasaki, and S. Yoshida, "Line-of-Sight MIMO Transmission for Achieving High Capacity Fixed Point Microwave Radio Systems", WCNC2008, IEEE, 2008, pp 1137-1142

NPD 2: Toshihisa Yamada, Daisuke Umehara, Koichiro Wakasugi, Takanori Wakamatsu, "A Consideration on Performance Evaluation of Linear/Rectangular Array LOS-MIMO Systems", IEICE Tech. Rep., Institute of Electronics, Information and Communication Engineers, CS2015-55 (2015-11), pp 59-64

SUMMARY OF THE INVENTION

Technical Problem

In recent years, along with the expansion of communication ranges, radio communication using sound waves, that is, under-sea radio is being studied. It can be said that the sea has a line-of-sight environment having few obstacles, and thus, the sea is an environment suitable for applying the LoS-MIMO technology as well as millimeter waves.

In the LoS-MIMO, orthogonality of the transmission line is generated by installing transmission antennas 304-1 to 304-M and reception antennas 401-1 to 401-N so as to satisfy a geometric condition of the above Equation (1). The LoS-MIMO has a characteristic that because of this condition, the channel capacity changes significantly when the distance D between the transmission and reception antennas changes, as in a graph shown in FIG. 18.

Thus, in applications such as undersea communication for use while moving in the sea, the distance D between the transmission and reception antennas changes with a passage of time, and the orthogonality of the transmission line is destructed to significantly change the channel capacity. Thus, there is a problem that it becomes difficult to form a parallel transmission line, and as a result, it becomes difficult to increase the transmission capacity by spatial multiplex transmission.

In view of the above circumstances, an object of the present invention is to provide a technique that makes it possible to maintain formation of a parallel transmission line in spatial multiplex transmission and to increase a transmission capacity even if a distance between transmission and reception antennas changes.

Means for Solving the Problem

One aspect of the present invention is a radio communication system including a radio transmission apparatus including a plurality of transmission antennas and a radio reception apparatus including a plurality of reception antennas. The radio transmission apparatus includes a communication distance measurement unit configured to measure a distance between the plurality of transmission antennas and the plurality of reception antennas, a selection unit configured to select a modulation scheme common to all of a plurality of frequency channels, the modulation scheme satisfying an average value of index values indicating an orthogonality between the plurality of transmission antennas and the plurality of reception antennas for each of the plurality of frequency channels according to the distance between the plurality of transmission antennas and the plurality of reception antennas measured by the communication distance measurement unit, and satisfying a predetermined desired bit error rate, a transmission signal generation unit configured to separate transmission data into the number of all the frequency channels, modulate each of the separated transmission data items by the selected common modulation scheme, and output transmission signals multiplexed by the number of multiplexing indicating the number of the plurality of transmission antennas to be used, and a radio signal transmitting unit configured to transmit each of the transmission signals. The radio reception apparatus includes a demodulation unit configured to demodulate a reception signal received by each of the plurality of reception antennas by a demodulation scheme corresponding to the modulation scheme to generate reception data.

One aspect of the present invention is the radio communication system, and the selection unit select the modulation scheme that is common to all the frequency channels and the number of multiplexing, the modulation scheme satisfying an average value of index values for each frequency channel indicating an orthogonality between the plurality of transmission antennas and the plurality of reception antennas, according to the distance between the plurality of transmission antennas and the plurality of reception antennas measured by the communication distance measurement unit and satisfying the predetermined desired bit error rate.

One aspect of the present invention is the radio communication system, and the transmission signal generation unit performs error correcting coding or interleaving on the transmission data of one or more frequency channels not satisfying the predetermined desired bit error rate among the plurality of frequency channels, and the radio reception apparatus performs error correcting decoding corresponding to the error correcting coding when the error correcting coding is performed on the reception data demodulated by the demodulation unit, and the radio reception apparatus performs deinterleaving corresponding to the interleaving when the interleaving is performed.

One aspect of the present invention is a radio communication method performed by a radio transmission apparatus including a plurality of transmission antennas and a radio reception apparatus including a plurality of reception antennas. The method includes, by the radio transmission apparatus, measuring a distance between the plurality of transmission antennas and the plurality of reception antennas, and selecting a modulation scheme common to all of a plurality of frequency channels, the modulation scheme satisfying an average value of index values indicating an orthogonality between the plurality of transmission antennas and the plurality of reception antennas for each of the plurality of frequency channels according to the measured distance between the plurality of transmission antennas and the plurality of reception antennas and satisfying a predetermined desired bit error rate, separating transmission data into the number of all the frequency channels, modulating each of the separated transmission data items by the selected common modulation scheme, and outputting transmission signals multiplexed by the number of multiplexing indicating the number of the plurality of transmission antennas to be used, and transmitting each of the transmission signals, and demodulating, by the radio reception apparatus, a reception signal received by each of the plurality of reception antennas by a demodulation scheme corresponding to the modulation scheme to generate reception data.

Effects of the Invention

According to the present invention, it is possible to maintain formation of a parallel transmission line in spatial multiplex transmission and to increase a transmission capacity even if a distance between transmission and reception antennas changes.

BRIEF DESCRIPTION OF DRAWINGS

FIG. 2 is a diagram illustrating a configuration of a transmission scheme lookup table according to the first embodiment.

FIG. 11 is a diagram illustrating a configuration of a channel capacity table according to the second embodiment.

DESCRIPTION OF EMBODIMENTS

First Embodiment

Figure 1:
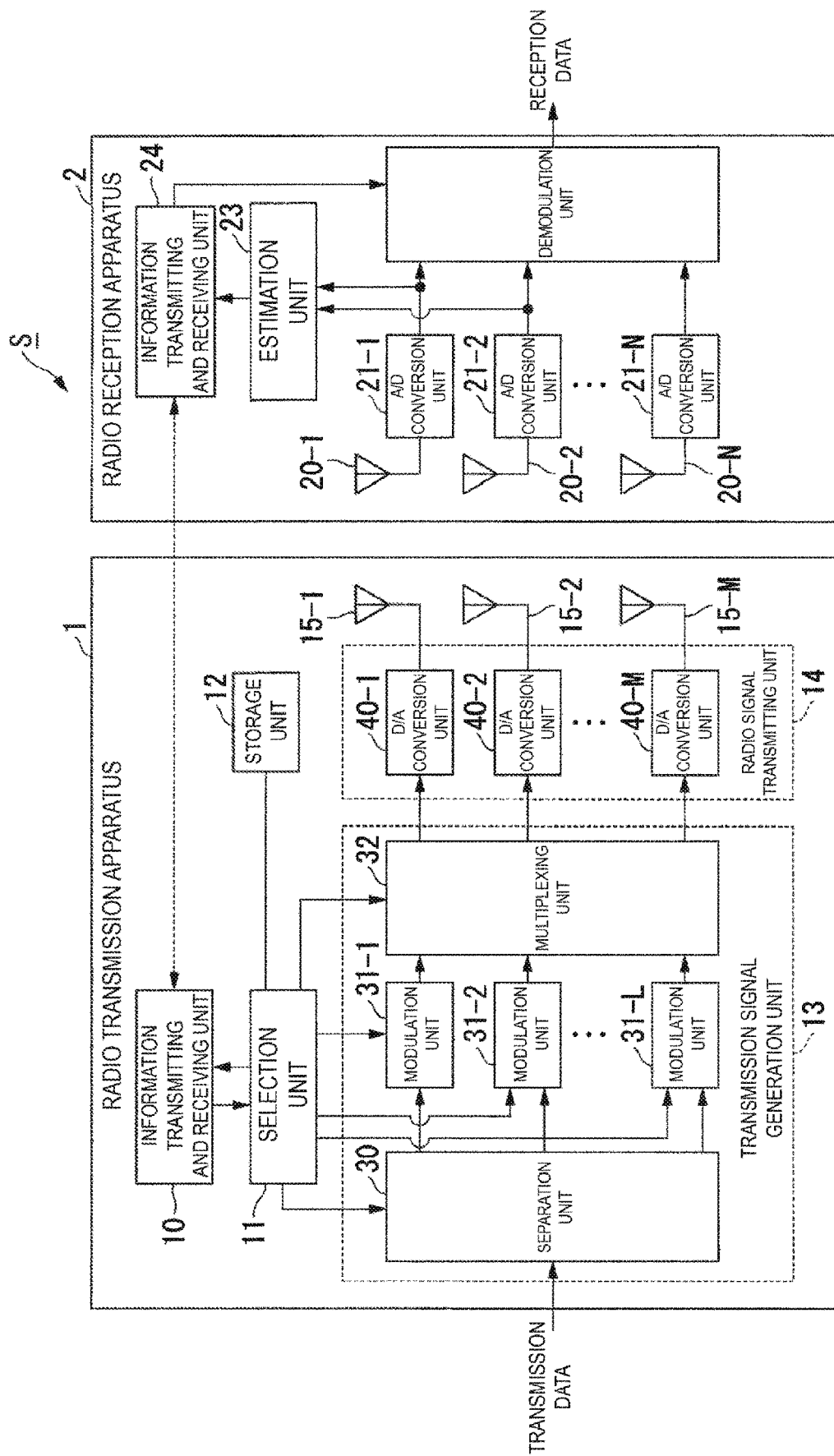
FIG. 1 is a block diagram illustrating a configuration of a radio communication system according to a first embodiment.

An embodiment of the present invention will be described below with reference to the drawings. FIG. 1 is a block diagram illustrating a configuration of a radio communication system S according to a first embodiment. The radio communication system S includes a radio transmission apparatus 1 and a radio reception apparatus 2. For example, it is assumed that the radio transmission apparatus 1 and the radio reception apparatus 2 are installed on different ships, and the two ships move in any direction.

Transmission antennas 15-1 to 15-M included in the radio transmission apparatus 1 and reception antennas 20-1 to 20-N included in the radio reception apparatus 2 are installed to be located in the sea with no obstacles between the transmission antennas 15-1 to 15-M and the reception antennas 20-1 to 20-N, that is, in a line-of-sight environment. Here, M and N are integers of 2 or greater, and M and N may be the same value or different values.

A length of an interval between each of the transmission antennas 15-1 to 15-M and a length of an interval between each of the reception antennas 20-1 to 20-N are predetermined. Furthermore, a radio signal transmitted and received between the transmission antennas 15-1 to 15-M and the reception antennas 20-1 to 20-N is a sound wave signal, for example, but may be any signal as long as the signal is a radio signal propagating in the sea.

The radio reception apparatus 2 includes the N reception antennas 20-1 to 20-N, N analog to digital (A/D) conversion units 21-1 to 21-N, a demodulation unit 22, an estimation unit 23, and an information transmitting and receiving unit 24.

The reception antennas 20-1 to 20-N receive radio signals transmitted by the radio transmission apparatus 1 and output the received signals as reception signals. The A/D conversion units 21-1 to 21-N convert analog reception signals output from the reception antennas 20-1 to 20-N connected with the A/D conversion units 21-1 to 21-N, respectively, into digital reception signals.

The demodulation unit 22 demodulates the digital reception signals output from the A/D conversion units 21-1 to 21-N with a demodulation scheme corresponding to a modulation scheme used in the radio transmission apparatus 1 to generate reception data.

The estimation unit 23 estimates, based on the digital reception signals output from the A/D conversion units 21-1 to 21-N, a distance between the transmission antennas 15-1 to 15-M and the reception antennas 20-1 to 20-N (hereinafter, referred to as "between transmission and reception antennas") and an angle indicating an arrival direction of the radio signals as viewed from the reception antennas 20-1 to 20-N. For example, the estimation unit 23 uses a MUSIC method described in the below-described cited reference to estimate the distance between the transmission and reception antennas and the angle indicating the arrival direction of the radio signals as viewed from the reception antennas 20-1 to 20-N.

Cited Reference: Nobuyoshi Kikuma, "Adaptive Signal Processing with Array Antenna", Kagaku Gijutsu Shuppan, Inc., 1999, p. 194

Note that there is a slight difference in distance between each of the transmission antennas 15-1 to 15-M and each of the reception antennas 20-1 to 20-N. However, the distance estimated by the MUSIC method is assumed to be a substantially average distance between the transmission and reception antennas.

The information transmitting and receiving unit 24 transmits estimation information including the distance between the transmission and reception antennas and the angle indicating the arrival direction of the radio signals, estimated by the estimation unit 23, to the radio transmission apparatus 1. Furthermore, the information transmitting and receiving unit 24 receives the information transmitted by the radio transmission apparatus 1 and outputs the received information to the demodulation unit 22.

The radio transmission apparatus 1 includes an information transmitting and receiving unit 10, a selection unit 11, a storage unit 12, a transmission signal generation unit 13, a radio signal transmitting unit 14, and the M transmission antennas 15-1 to 15-M.

The information transmitting and receiving unit 10 receives the estimation information transmitted by the information transmitting and receiving unit 24 of the radio reception apparatus 2. Furthermore, the information transmitting and receiving unit 10 transmits the information output by the selection unit 11 to the information transmitting and receiving unit 24 of the radio reception apparatus 2. Note that a transmission capacity required for transmitting and receiving the information between the information transmitting and receiving unit 10 and the information transmitting and receiving unit 24 may be a small transmission capacity. Furthermore, the communication between the information transmitting and receiving unit 10 and the information transmitting and receiving unit 24 is performed by, for example, radio communication via a sea with good communication quality, or radio communication of electromagnetic waves propagating in an air with good communication quality.

The storage unit 12 previously stores information on the length of the interval between the transmission antennas 15-1 to 15-M and the length of the interval between the reception antennas 20-1 to 20-N, a transmission scheme lookup table 121 illustrated in FIG. 2, and transmission scheme information corresponding to a transmission scheme shown in the transmission scheme lookup table 121.

Here, the transmission scheme information is information including information indicating a modulation scheme and the number of multiplexing in the LoS-MIMO scheme. The number of multiplexing is a value indicating the number of the transmission antennas 15-1 to 15-M to be used. For example, when only the transmission antenna 15-1 and the transmission antenna 15-M at both ends are used, the number of multiplexing is "2". The information indicating the modulation scheme includes information indicating a scheme such as quadrature amplitude modulation (QAM) and a degree of multilevel in the modulation scheme, and information of the coding rate.

As illustrated in FIG. 2, the transmission scheme lookup table 121 includes a plurality of transmission scheme lookup tables 121-1 to 121-X corresponding in number to combinations of the distance between the transmission and reception antennas and the angle indicating the arrival direction of the radio signals. In addition, X is an integer coinciding with the number of predetermined combinations of the distance and the angle. Each of the transmission scheme lookup tables 121-1 to 121-X has the same data format.

The data format will be described by using the transmission scheme lookup table 121-1 illustrated in FIG. 2 in an example. The transmission scheme lookup table 121-1 has items of "distance" and "angle" as an index. In the "distance" item, a value indicating a length in units of [m] is written. In the "angle" item, a value indicating a magnitude of the angle in units of [degree] is written.

The transmission scheme lookup table 121-1 has a frequency channel item in a vertical item. A value written in the frequency channel item is, for example, a center frequency of the frequency channel, and is written in units of [Hz].

Furthermore, the transmission scheme lookup table 121-1 has an item of information indicating types of the transmission scheme in a horizontal item. Each type of the transmission scheme is associated with the transmission scheme information stored in the storage unit 12.

In FIG. 2, "highest transmission rate", "high transmission rate", "medium transmission rate", and "low transmission rate" associated with the information indicating the types of the transmission scheme information indicate categories obtained by dividing the transmission rate by three thresholds. It is assumed that the three thresholds are a first transmission rate threshold, a second transmission rate threshold, and a third transmission rate threshold, and have a relationship of the first transmission rate threshold>the second transmission rate threshold>the third transmission rate threshold.

At this time, the "highest transmission rate" is a category to which a transmission rate exceeding the first transmission rate threshold belongs. The "high transmission rate" is a category to which a transmission rate being equal to or lower than the first transmission rate threshold and exceeding the second transmission rate threshold belongs. The "medium transmission rate" is a category to which a transmission rate being equal to or lower than the second transmission rate threshold and exceeding the third transmission rate threshold belongs. The "low transmission rate" is a category to which a transmission rate equal to or lower than the third transmission rate threshold belongs. Thus, if a transmission scheme A is selected, a scheme of transmitting with a highest transmission rate, that is, a highest transmission capacity, is selected. Furthermore, if a transmission scheme D is selected, a scheme of transmitting with a lowest transmission capacity is selected.

Each element specified by the two vertical and horizontal items is written with symbols of "Good", "Fair", and "Poor", based on the distance, the angle, and the magnitude of the bit error rate actually measured in advance for each transmission scheme. "Good", "Fair", and "Poor" indicate a category obtained by dividing an actually measured bit error rate by two thresholds. It is assumed that the two thresholds are the first bit error rate threshold and the second bit error rate threshold, and have a relationship of the first bit error rate threshold<the second bit error rate threshold.

At this time, "Good" indicates that the bit error rate is less than the first bit error rate threshold. Furthermore, "Fair" indicates that the bit error rate is equal to or greater than the first bit error rate threshold and less than the second bit error rate threshold. Furthermore, "Poor" indicates that the bit error rate is equal to or greater than the second bit error rate threshold.

Furthermore, the selection unit 11 refers to the transmission scheme lookup table 121 corresponding to the distance between the transmission and reception antennas and the angle of the arrival direction of the radio signals to select a transmission scheme satisfying a maximum transmission capacity, a transmission rate equal to or greater than a desired transmission rate, and a desired bit error rate, for each frequency channel. If it is not possible to select a transmission scheme providing a transmission rate equal to or greater than a desired transmission rate and satisfying a desired bit error rate, for a certain frequency channel, the selection unit 11 does not select the certain frequency channel, and the certain frequency channel is left unused.

Furthermore, the selection unit 11 outputs, to the transmission signal generation unit 13, selection information including the information indicating the frequency channel to be used and the transmission scheme information for each frequency channel to be used. Furthermore, the selection unit 11 outputs the selection information to the information transmitting and receiving unit 10.

The selection unit 11 does not directly output the selection information to each of the modulation units 31-1 to 31-L of the transmission signal generation unit 13, but outputs the information indicating one frequency channel selected from among the frequency channels to be used so that each of the frequency channels differs and the transmission scheme information corresponding to the frequency channel.

The transmission signal generation unit 13 includes a separation unit 30, the L modulation units 31-1 to 31-L, and a multiplexing unit 32. Here, L may be any value as long as the value is an integer of 2 or greater, and may be, for example, the number of frequency channels usable in the sea. Furthermore, L may be the same value as M or may be a different value from M. In addition, L may be the same value as N or may be a different value from N.

The separation unit 30 counts the number of frequency channels included in the selection information output by the selection unit 11. The separation unit 30 separates the transmission data into the counted number of the frequency channels, and outputs the separated transmission data items to the modulation units 31-1 to 31-L.

Each of the modulation units 31-1 to 31-L is connected to the selection unit 11. Each of the modulation units 31-1 to 31-L captures the information indicating the frequency channel and the transmission scheme information output by the selection unit 11 to each of the modulation units 31-1 to 31-L. Here, the information indicating the frequency channel is, for example, a center frequency of the frequency channel. Each of the modulation units 31-1 to 31-L modulates the separated transmission data output by the separation unit 30 to each of the modulation units 31-1 to 31-L, with the modulation scheme indicated in the captured center frequency and transmission scheme information to generate transmission signals.

The multiplexing unit 32 separates each of the transmission signals for each frequency channel output by the modulation units 31-1 to 31-L according to the number of multiplexing for each frequency channel indicated in the transmission scheme information included in the selection information output by the selection unit 11. The multiplexing unit 32 outputs each of the separated transmission signals to digital to analog (D/A) conversion units 40-1 to 40-M, that is, an output destination previously determined according to the number of multiplexing.

When the number of multiplexing is a value smaller than M that is the number of transmission antennas 15-1 to 15-M, a combination of the transmission antennas 15-1 to 15-M used for transmitting a radio signal is to be predetermined. For example, when the number of multiplexing is "2", the use of transmission antennas at both ends having the widest spacing therebetween and allowing streams of each radio signal to be easily independent, in other words, the use of the transmission antenna 15-1 and the transmission antenna 15-M is predetermined. Information on the combination of the transmission antennas 15-1 to 15-M according to the number of multiplexing is previously stored in an internal storage area of the multiplexing unit 32.

The radio signal transmitting unit 14 includes the M D/A conversion units 40-1 to 40-M. Each of the D/A conversion units 40-1 to 40-M converts the digital transmission signals output by the multiplexing unit 32 into analog transmission signals. Each of the D/A conversion units 40-1 to 40-M outputs each of the converted analog transmission signals to the transmission antennas 15-1 to 15-M connected with each of the D/A conversion units 40-1 to 40-M. The transmission antennas 15-1 to 15-M transmit the analog transmission signals output by the D/A conversion units 40-1 to 40-M to the radio reception apparatus 2 as radio signals.

Processing of Radio Communication System of First Embodiment

Figure 3:
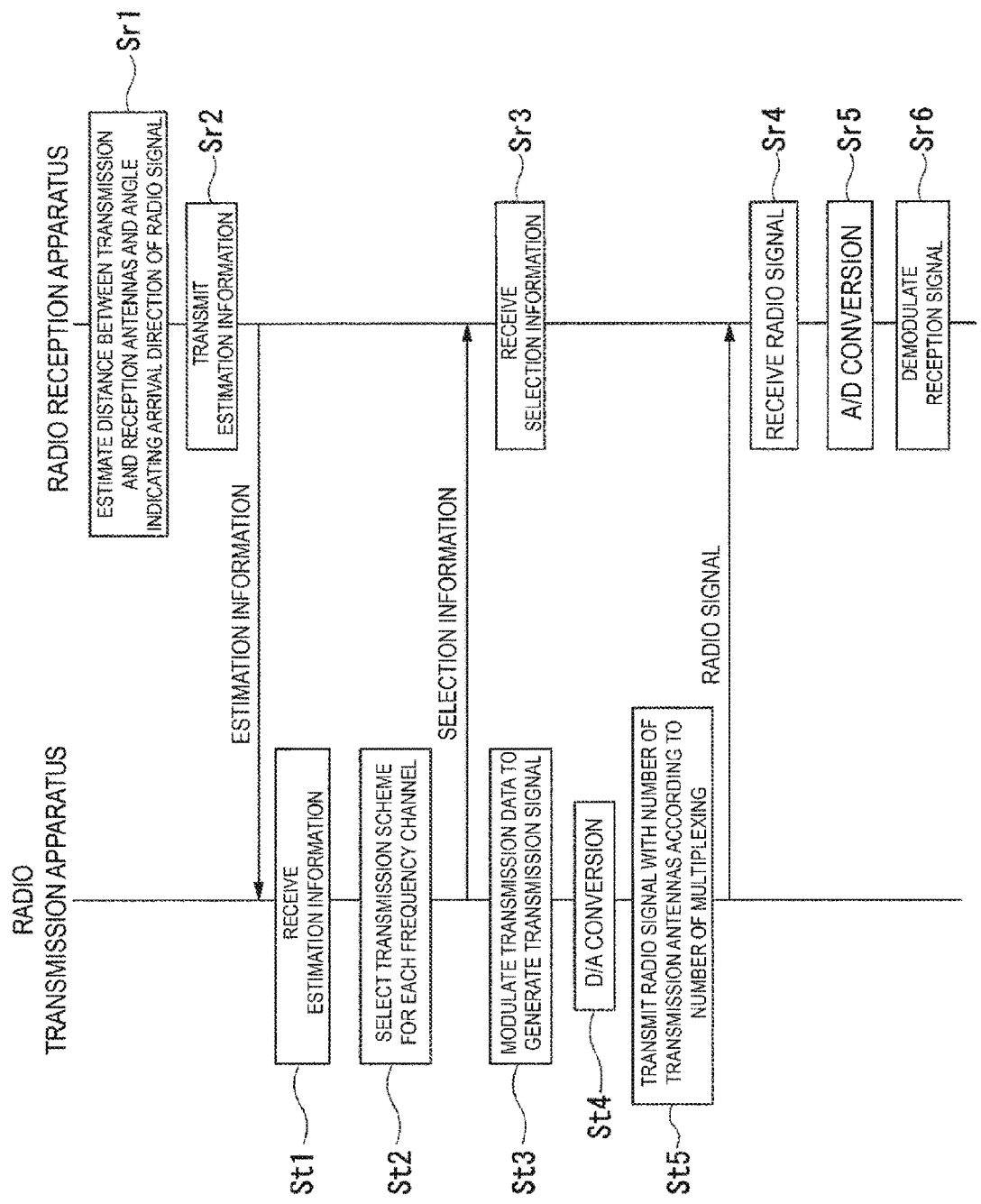
FIG. 3 is a sequence diagram illustrating a flow of processes by the radio communication system according to the first embodiment.

FIG. 3 is a sequence diagram illustrating a flow of processes of the radio communication system S according to the first embodiment. It is assumed that the transmission antennas 15-1 to 15-M of the radio transmission apparatus 1 are modulated by an arbitrary modulation scheme and transmit a radio signal spatially multiplexed by any of the numbers of multiplexing.

The reception antennas 20-1 to 20-N of the radio reception apparatus 2 receive the radio signal transmitted by the radio transmission apparatus 1. The A/D conversion units 21-1 to 21-N convert the analog reception signal output by the reception antennas 20-1 to 20-N into a digital reception signal.

The estimation unit 23 captures the digital reception signal output by the A/D conversion units 21-1 to 21-N and applies the MUSIC method to the captured reception signal to estimate the distance between the transmission and reception antennas and the angle indicating the arrival direction of the radio signal (step Sr1).

The estimation unit 23 outputs estimation information including the estimated distance between the transmission and reception antennas and the estimated angle indicating the arrival direction of the radio signal, to the information transmitting and receiving unit 24. The information transmitting and receiving unit 24 transmits the estimation information output by the estimation unit 23 to the information transmitting and receiving unit 10 of the radio transmission apparatus 1 (step Sr2).

The information transmitting and receiving unit 10 receives the estimation information transmitted by the information transmitting and receiving unit 24, and outputs the received estimation information to the selection unit 11 (step St1).

The selection unit 11 captures the estimation information output by the information transmitting and receiving unit 10, and reads the distance between the transmission and reception antennas and the information of the angle of the arrival direction of the radio signal included in the captured estimation information.

The selection unit 11 refers to the transmission scheme lookup tables 121-1 to 121-X corresponding to the distance between the transmission and reception antennas and the angle of the arrival direction of the radio signal captured from the information transmitting and receiving unit 10.

Here, it is assumed that the distance between the transmission and reception antennas included in the estimation information is "10 m" and the angle of the arrival direction of the radio signal is "30 degrees". The selection unit 11 refers to the transmission scheme lookup table 121-1 corresponding to the distance "10 m" and the angle "30 degrees".

The selection unit 11 selects a transmission scheme that satisfies a maximum transmission capacity, a transmission rate equal to or greater than a desired transmission rate, and a desired bit error rate, for each frequency channel. For example, it is assumed that the desired bit error rate is a bit error rate less than the first bit error rate threshold. In this case, the selection unit 11 selects the transmission scheme on the condition that the bit error rate is "Good" in the transmission scheme lookup table 121-1. Furthermore, it is assumed that the desired transmission rate is the third transmission rate threshold. In this case, the selection unit 11 selects a transmission scheme in the transmission scheme lookup table 121-1 on the condition that the transmission scheme is the transmission scheme C or higher, that is, any one of the transmission schemes A, B, and C.

The selection unit 11 detects a transmission scheme having a bit error rate of "Good" in records of frequencies $f_0$ to $f_5$ of the transmission scheme lookup table 121-1. For the frequency $f_0$, the selection unit 11 detects no transmission scheme having the bit error rate "Good", and thus, the selection unit 11 does not select a frequency channel of the frequency $f_0$. On the other hand, the frequencies $f_1$ to $f_5$ have a transmission scheme having the bit error rate "Good". Furthermore, the selection unit 11 selects, as a frequency channel to be used, a frequency channel having a transmission scheme with a bit error rate "Good" and satisfying the condition that the transmission scheme is any of the transmission schemes A, B, and C. In this case, the frequency $f_5$ has the bit error rate of "Good" in the transmission scheme D, but the bit error rate is "Poor" or "Fair" in the transmission scheme A, B, and C. Thus, as a frequency channel not having high orthogonality, the selection unit 11 excludes the frequency channel with frequencies $f_0$ and $f_5$. As a result, for each of the frequencies $f_1$ to $f_4$ that are frequency channels to be used, the selection unit 11 selects the transmission scheme C, the transmission scheme B, the transmission scheme C, and the transmission scheme C, that is, a transmission scheme providing a maximum transmission capacity and a transmission rate equal to or greater than a desired transmission rate and satisfying the bit error rate "Good".

The selection unit 11 reads, from the storage unit 12, the transmission scheme information corresponding to the selected transmission scheme B and transmission scheme C. Here, it is assumed that the number of multiplexing included in the transmission scheme information of the transmission scheme C is "2" and the number of multiplexing included in the transmission scheme information of the transmission scheme B is "M".

The selection unit 11 generates the selection information including a combination of the frequency $f_1$ and the transmission scheme information of the transmission scheme C, a combination of the frequency $f_2$ and the transmission scheme information of the transmission scheme B, a combination of the frequency $f_3$ and the transmission scheme information of the transmission scheme C, and a combination of the frequency $f_4$ and the transmission scheme information of the transmission scheme C (step St2). The selection unit 11 outputs the generated selection information to the information transmitting and receiving unit 10. The information transmitting and receiving unit 10 transmits the selection information output by the selection unit 11 to the information transmitting and receiving unit 24 of the radio reception apparatus 2.

The information transmitting and receiving unit 24 receives the selection information transmitted by the information transmitting and receiving unit 10, and outputs the received selection information to the demodulation unit 22. The demodulation unit 22 of the radio reception apparatus 2 captures the selection information output by the information transmitting and receiving unit 24, and sets the demodulation scheme corresponding to the modulation scheme for each frequency channel included in the selection information (step Sr3).

The selection unit 11 outputs the generated selection information to the transmission signal generation unit 13. That is, the selection unit 11 outputs the frequency $f_1$ and transmission scheme information of the transmission scheme C included in the selection information to the modulation unit 31-1, outputs the frequency $f_2$ and transmission scheme information of the transmission scheme B included in the selection information to the modulation unit 31-2, outputs the frequency $f_3$ and transmission scheme information of the transmission scheme C included in the selection information to the modulation unit 31-3, and outputs the frequency 14 and transmission scheme information of the transmission scheme C included in the selection information to the modulation unit 31-4. Furthermore, the selection unit 11 outputs the selection information to the separation unit 30 and the multiplexing unit 32.

The separation unit 30 counts the number of frequency channels included in the selection information. Here, there are four frequency channels in which the frequencies $f_1$ to $f_4$ are center frequencies, and as a result, the count result of "4" is obtained. The separation unit 30 separates the transmission data into four data items, and outputs each of the four separated transmission data items to the modulation units 31-1 to 31-4.

The modulation units 31-1, 31-3, and 31-4 modulate the transmission data output by the separation unit 30 to generate the transmission signal, according to the modulation scheme included in the transmission scheme information of the transmission scheme C and the frequencies $f_1$, $f_3$, $f_4$ applied to each of the modulation units 31-1, 31-3, and 31-4.

Each of the modulation units 31-1, 31-3, and 31-4 outputs the generated transmission signal to the multiplexing unit 32. The multiplexing unit 32 reads "2" indicating the number of multiplexing from the transmission scheme information of the transmission scheme C and the transmission scheme D included in the selection information. The multiplexing unit 32 separates the transmission signal output by each of the modulation units 31-1, 31-3, and 31-4 into two, and outputs each of the separated transmission signals to the D/A conversion unit 40-1 and the D/A conversion unit 40-M at both the ends.

On the other hand, according to the frequency $f_2$ and the modulation scheme included in the transmission scheme information of the transmission scheme B, the modulation unit 31-2 modulates the transmission data output by the separation unit 30 to generate a transmission signal. The modulation unit 31-2 outputs the generated transmission signal to the multiplexing unit 32. The multiplexing unit 32 reads "M" indicating the number of multiplexing from the transmission scheme information of the transmission scheme B included in the selection information. The multiplexing unit 32 separates the transmission signal generated by the modulation unit 31-2 into M transmission signals, and outputs each of the M separated transmission signals to the D/A conversion units 40-1 to 40-M (step St3).

At this time, the D/A conversion unit 40-1 and the D/A conversion unit 40-M at both the ends receive a part of the transmission signal generated by the modulation unit 31-1 and a part of the transmission signal generated by the modulation unit 31-2, which have been combined by the multiplexing unit 32.

The D/A conversion units 40-1 to 40-M convert the digital transmission signals output by the multiplexing unit 32 to each of the D/A conversion units 40-1 to 40-M, into analog transmission signals (step St4). The D/A conversion units 40-1 to 40-M transmit the converted analog transmission signals to the radio reception apparatus 2 through the transmission antennas 15-1 to 15-M (step St5).

The reception antennas 20-1 to 20-N receive the radio signals transmitted by the radio transmission apparatus 1 and output the received signals as reception signals (step Sr4). The A/D conversion units 21-1 to 21-N convert the analog reception signals output by the reception antennas 20-1 to 20-N connected with each of the A/D conversion units 21-1 to 21-N into digital reception signals, and output the converted digital reception signals to the demodulation unit 22 and the estimation unit 23 (step Sr5).

The demodulation unit 22 captures the digital reception signals output by the A/D conversion units 21-1 to 21-N, combines the captured reception signals, demodulates the receptions signals with the demodulation scheme set in step Sr3 to generate reception data (step Sr6).

The radio transmission apparatus 1 repeats the processes of steps St1 to St5, and the radio reception apparatus 2 repeats the processes of steps Sr1 to Sr6. As a result, even when a ship equipped with the radio transmission apparatus 1 and a ship equipped with the radio reception apparatus 2 move in any direction and the distance between the transmission and reception antennas changes, the estimation unit 23 of the radio reception apparatus 2 continues to estimate a new distance between the transmission and reception antennas and the arrival direction of the radio signal. This enables the selection unit 11 of the radio transmission apparatus 1 to continue to select a frequency channel having high orthogonality.

Figure 4:
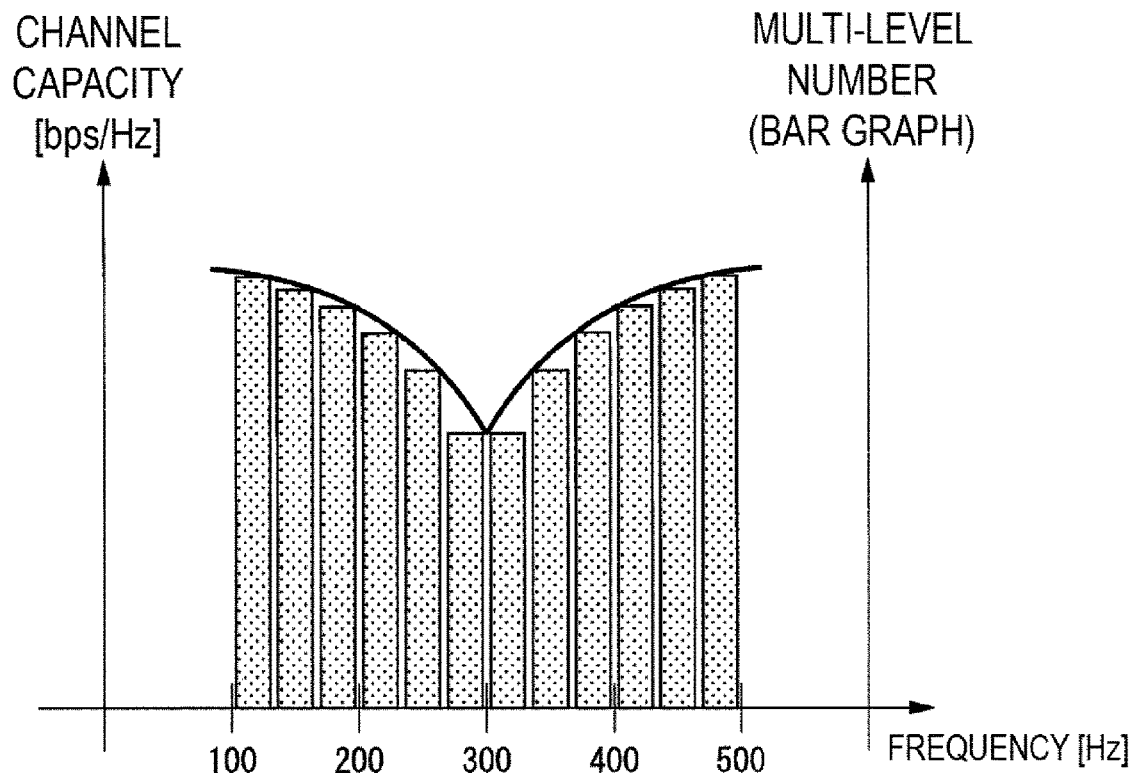
FIG. 4 is a graph showing a relationship between a channel capacity and a multi-level number for each frequency channel when a transmission scheme is assigned to each frequency channel used in the first embodiment (part 1).
Figure 5:
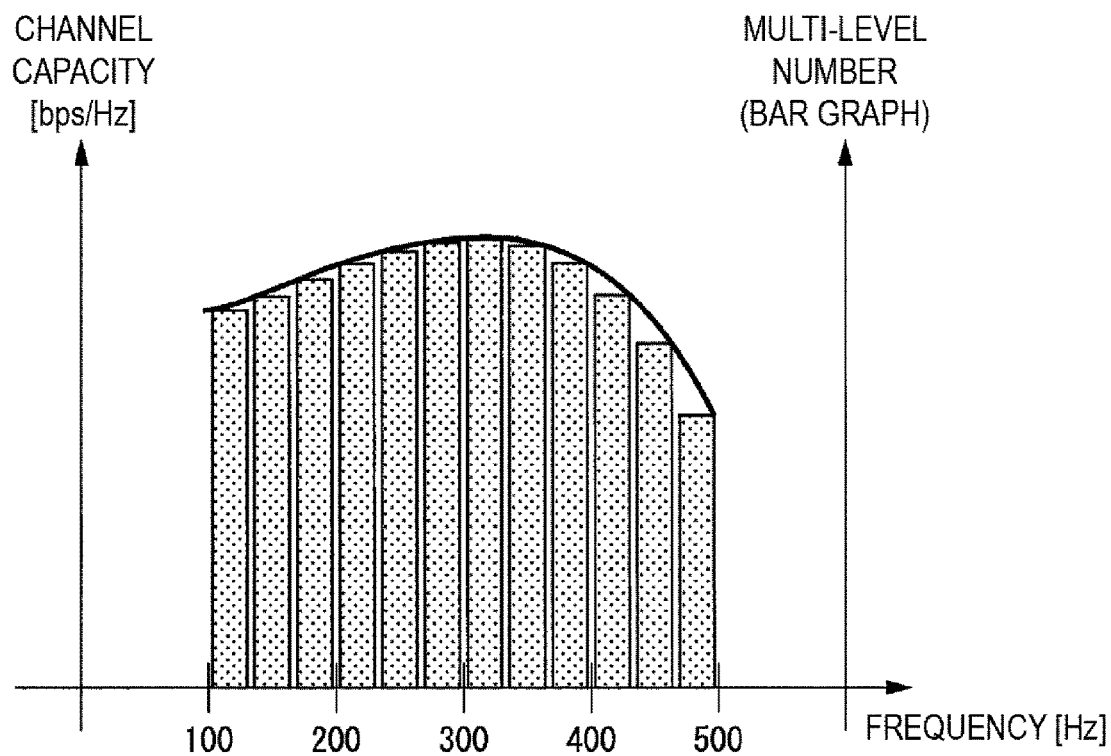
FIG. 5 is a graph showing a relationship between a channel capacity and a multi-level number for each frequency channel when a transmission scheme is assigned to each frequency channel used in the first embodiment (part 2).

For example, FIG. 4 is a graph showing a relationship between a channel capacity for each frequency channel when the distance between the transmission and reception antennas is "10 m" and a multi-level number in a modulation scheme. Furthermore, FIG. 5 is a graph showing a relationship between a channel capacity for each frequency channel when the distance between the transmission and reception antennas is "15 m" and a multi-level number in a modulation scheme. In FIGS. 4 and 5, a horizontal axis is a frequency value. Here, the channel capacity is a value in units of [bps/Hz], and is a value indicating a transmission capacity per 1 Hz. Even if the distance between the transmission and reception antennas and the angle indicating the arrival direction of the radio signal are the same, the orthogonality of a transmission line changes depending on the frequency to change the channel capacity. In other words, the channel capacity is an index value indicating the orthogonality between the transmission and reception antennas, and the larger the value of the channel capacity, the higher the orthogonality.

In FIGS. 4 and 5, a change characteristic indicated by the solid line shows a change of the channel capacity, and the bar graph shows the multi-level number. In the first embodiment, an appropriate transmission scheme is selected for each frequency channel to be used, and thus, the value of the multi-level number changes for each frequency channel.

The change characteristic of the channel capacity in the graph of FIG. 4 reveals that the frequencies near "100 Hz" and "500 Hz" at both the ends have a high channel capacity, and the frequencies near "300 Hz" at the center have a low channel capacity. Thus, the selection unit 11 reduces the multi-level number in the modulation scheme so that the bit error rate does not increase near the frequency of "300 Hz".

On the other hand, the change characteristic of the channel capacity in the graph of FIG. 5 reveals that the frequencies near "300 Hz" have a high channel capacity, and the frequencies around "100 Hz" and "500 Hz" at both the ends have a lower channel capacity. Thus, the selection unit 11 reduces the multi-level number in the modulation scheme so that the bit error rates do not increase near the frequencies of "100 Hz" and "500 Hz". Furthermore, the channel capacity near "500 Hz" is smaller than the channel capacity near "100 Hz", and thus, the multi-level number near "500 Hz" is even smaller than the multi-level number near "100 Hz".

Note that in step St2 described above, the selection unit 11 uses the transmission scheme lookup table 121 illustrated in FIG. 2 to select the transmission scheme in the frequency channel to be used and the frequency channel to be used. On the other hand, the selection unit 11 may calculate the channel capacity without using the transmission scheme lookup table 121 to select a transmission scheme satisfying a desired bit error rate, having a maximum transmission capacity, and providing a transmission rate equal to or greater than a desired transmission rate.

It can be said that each element of the transmission scheme lookup table 121 illustrated in FIG. 2 indicates the channel capacity specified by the distance, the angle, the frequency channel, the transmission scheme, and the bit error rate. The transmission scheme lookup table 121 shows the bit error rate in the three categories of "Good", "Fair", and "Poor". Thus, it can be said that the transmission scheme lookup table 121 shows the channel capacity for each distance and angle by the combination of four transmission schemes, six frequency channels, and three bit error rates. The channel capacity shown in the transmission scheme lookup table 121 is a value based on an actually measured value, but the channel capacity may be calculated according to an arithmetic operation.

It is possible to calculate the channel capacity according to, for example, a technique provided in the following cited reference when the number of transmission antennas and the number of reception antennas are the same in number as M.

Cited Reference: Kentaro Nishimori, Naoki Honma, Tomohiro Seki, and Ken Hiraga, "On the Transmission Method for Short-Range MIMO Communication", IEEE Transactions On Vehicular Technology, Vo. 60, No. 3, March 2011, pp 1247-1251

For example, the distance $r_{ij}$ between each of the reception antennas 20-1 to 20-$i$ to 20-M and each of the transmission antennas 15-1 to 15-$j$ to 15-M can be expressed in vector according to the following Equation (2).

$$r_{ij} = (x_{Ri} - x_{Tj}, y_{Ri} - y_{Tj}, D) \tag{2}$$

In Equation (2), $x_{Tj}$ and $y_{Tj}$ are an X coordinate value and a Y coordinate value of the transmission antenna 15-$j$, respectively. Furthermore, $x_{Ri}$ and $y_{Ri}$ are an X coordinate value and a Y coordinate value of the reception antenna 20-$i$, respectively. Relative XY coordinates of $x_{Tj}$ and $y_{Tj}$, and $x_{Ri}$ and $y_{Ri}$ can be evaluated based on the angle indicating the arrival direction of the radio signal included in the estimation information. Furthermore, D is a distance between the transmission and reception antennas included in the estimation information $r_{ij}$ is evaluated by the following Equation (3).

$$r_{ij} = \sqrt{(x_{Ri} - x_{Tj})^2 + (y_{Ri} - y_{Tj})^2 + D^2} \tag{3}$$

A channel coefficient $h_{ij}$ between the transmission and reception antennas is evaluated by the following Equation (4).

[Math. 4]

$$h_{ij} = E_T(\theta_{ij}, \phi_{ij}) E_R(\pi - \theta_{ij}, \pi + \phi_{ij}) \cdot e^{-jkr_{ij}} \left( \frac{\lambda_0}{4\pi r_{ij}} \right) \tag{4}$$

In Equation (4), $(\theta_{ij}, \varphi_{ij})$ is a coordinate value in which $r_{ij}$ is represented by a spherical coordinate system. k and $\lambda_0$ are wave numbers and wavelengths, respectively and have different values for each frequency channel. $E_T$ and $E_R$ are functions of $(\theta_{ij}, \varphi_{ij})$, and are calculated as a square root of a gain of the transmission antenna and a square root of a gain of the reception antenna, respectively.

A matrix whose elements are the channel coefficient $h_{ij}$ is a channel matrix H. The channel matrix H through singular value decomposition is expressed by the following Equation (5).

[Math. 5]

$$H = U\Lambda V^H \tag{5}$$

In Equation (5), the matrix U and the matrix V are unitary matrices. The matrix $\Lambda$ is a matrix whose element is a square root of an eigenvalue.

It is possible to calculate the channel capacity C according to the following Equation (6) by using the eigenvalue evaluated by the matrix $\Lambda$.

[Math. 6]

$$C = \sum_{i=1}^{M} \log_2 \left( 1 + \lambda_i \frac{\gamma_0}{M} \right) \tag{6}$$

In Equation (6), $\lambda_i$ is an eigenvalue obtained from the matrix $\Lambda$, and $\gamma_0$ is a signal to noise ratio (SNR), that is, a signal-to-noise ratio. When the transmission scheme is defined, the SNR required to satisfy the desired bit error rate is defined.

Thus, in the process of step St2 described above, instead of referencing the transmission scheme lookup table 121, the selection unit 11 may select the transmission scheme for each frequency channel as follows. For example, the selection unit 11 calculates the channel capacity for each frequency channel according to Equation (6), based on the estimation information received by the information transmitting and receiving unit 10, the length of the interval between the transmission antennas 15-1 to 15-M and the length of the interval between the reception antennas 20-1 to 20-N stored in the storage unit 12, the distance between the transmission and reception antennas, and the SNR obtained from a transmission power when the radio transmission apparatus 1 performs transmission. The selection unit 11 selects the frequency channel exceeding a channel capacity threshold by which a value of the calculated channel capacity value for each frequency channel is predetermined, as the frequency channel to be used. This enables the selection unit 11 to select a frequency channel having high orthogonality. The selection unit 11 selects a transmission scheme satisfying a desired bit error rate for the SNR, having the highest transmission rate, and providing a transmission rate equal to or greater than a desired transmission rate, for the frequency channel selected as the frequency channel to be used.

Note that the selection unit 11 is configured to select a transmission scheme satisfying a maximum transmission capacity, a transmission rate equal to or greater than a desired transmission rate, and a desired bit error rate, for each frequency channel. Here, if all of the transmission schemes have a transmission rate equal to or greater than the desired transmission rate, the selection unit 11 may select a transmission scheme providing a maximum transmission capacity and satisfying a desired bit error rate, for each frequency channel.

In a configuration of the first embodiment described above, the estimation unit 23 of the radio reception apparatus 2 estimates the distance between the transmission and reception antennas and the angle indicating the arrival direction of the radio signal, based on the reception signals output by the A/D conversion units 21-1 to 21-N. The selection unit 11 of the radio transmission apparatus 1 selects a frequency channel to be used, based on the channel capacity for each frequency channel indicating the orthogonality between the transmission antenna and the reception antenna, the distance between the transmission and reception antennas and the angle indicating the arrival direction of the radio signal, estimated by the estimation unit 23, and the predetermined desired bit error rate. The selection unit 11 selects a transmission scheme providing the maximum transmission capacity for each selected frequency channel. The transmission signal generation unit 13 separates the transmission data into the number of frequency channels to be used, modulates each of the separated transmission data items with the transmission scheme corresponding to each of the separated transmission data items to generate the transmission signal. The transmission signal generation unit 13 multiplexes the generated transmission signal by the number of multiplexing indicated in the transmission scheme to output the multiplexed signals.

As a result, when the transmission scheme providing the maximum transmission capacity and satisfying the desired bit error rate is selected for each frequency channel, it is possible to perform radio communication having a high channel capacity. Furthermore, it is configured so that the frequency channel not satisfying the desired bit error rate is not used, and thus, it is possible to select a frequency channel having high orthogonality.

Furthermore, the transmission signal generation unit 13 of the radio transmission apparatus 1 includes a plurality of modulation units 31-1 to 31-L assigned with a plurality of frequency channels. As a result, the plurality of frequency channels are available. Thus, even if the distance between the transmission and reception antennas changes and the orthogonality of the transmission line is destructed, it is possible to selectively switch the frequency channel having high orthogonality in the transmission line. Thus, it is possible to stably obtain a large transmission capacity in a mobile communication environment. Furthermore, in the undersea radio communication, unlike radio waves propagating in the air, a frequency band usable by the radio communication system S is not defined by regulation. Thus, it is possible to obtain a wide frequency as needed. This enables the radio communication system S to select a frequency channel having high orthogonality between the transmission and reception antennas, that is, a frequency channel allowing for high-quality and large-capacity radio communication, from wide frequency bands. With the configuration of the first embodiment as described above, even if the distance between the transmission and reception antennas changes in a line-of-sight environment, it is possible to maintain formation of a parallel transmission line in the spatial multiplex transmission to increase a transmission capacity.

Figure 6:
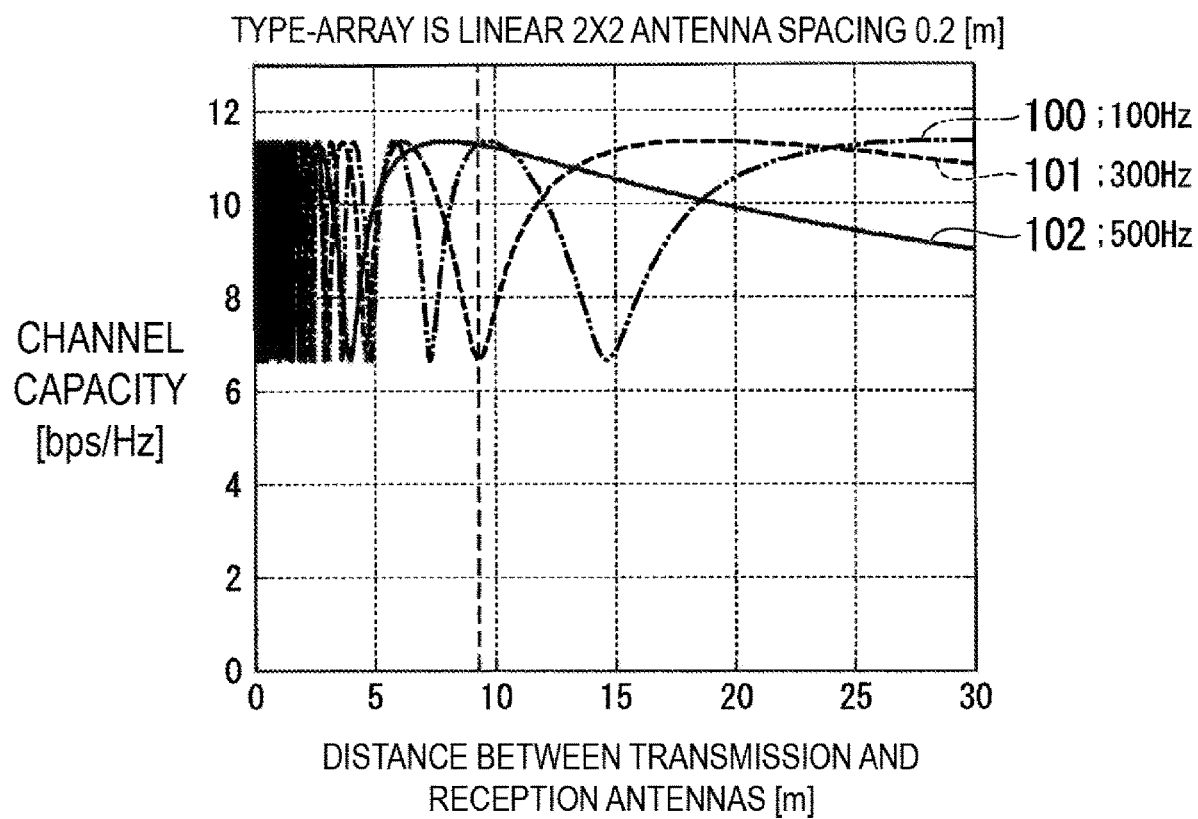
FIG. 6 is a graph showing a distance characteristic of a channel capacity for each frequency when a LoS-MIMO technology is used.
Figure 7:
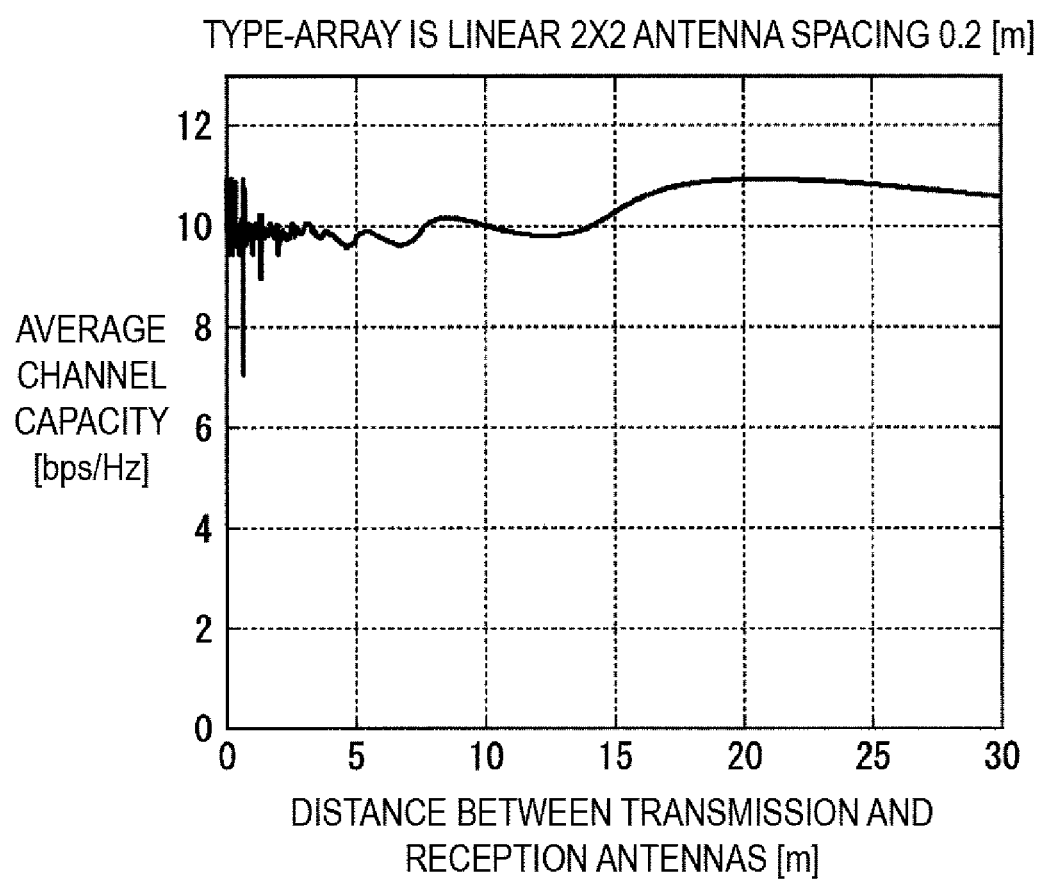
FIG. 7 is a graph showing a distance characteristic of a channel capacity when the configuration of the first embodiment is used.

FIGS. 6 and 7 are graphs showing the distance between the transmission and reception antennas and the change characteristic of the channel capacity. In FIGS. 6 and 7, a horizontal axis indicates the distance between the transmission and reception antennas, and a vertical axis indicates the channel capacity.

In FIG. 6, reference numeral 100 indicates a change characteristic of a frequency "100 Hz", reference numeral 101 indicates a change characteristic of a frequency "300 Hz", and reference numeral 102 indicates a change characteristic of a frequency "500 Hz". As can be seen from FIG. 6, there is a characteristic having a great channel capacity change depending on the frequency when the distance between the transmission and reception antennas changes.

On the other hand, FIG. 7 is a graph showing the change characteristics between the distance between the transmission and reception antennas and the channel capacity when the configuration of the first embodiment is applied. As shown in FIG. 7, in the configuration of the first embodiment, a plurality of frequency channels are used, excluding frequency channels with no transmission scheme satisfying the desired bit error rate. Thus, changes in channel capacity different for each frequency channel are averaged, and the channel capacity can be maintained at about 10 [bps/Hz] even if the distance between the transmission and reception antennas changes. That is, it can be said that the orthogonality can be maintained even if the distance between the transmission and reception antennas changes.

Second Embodiment

Figure 8:
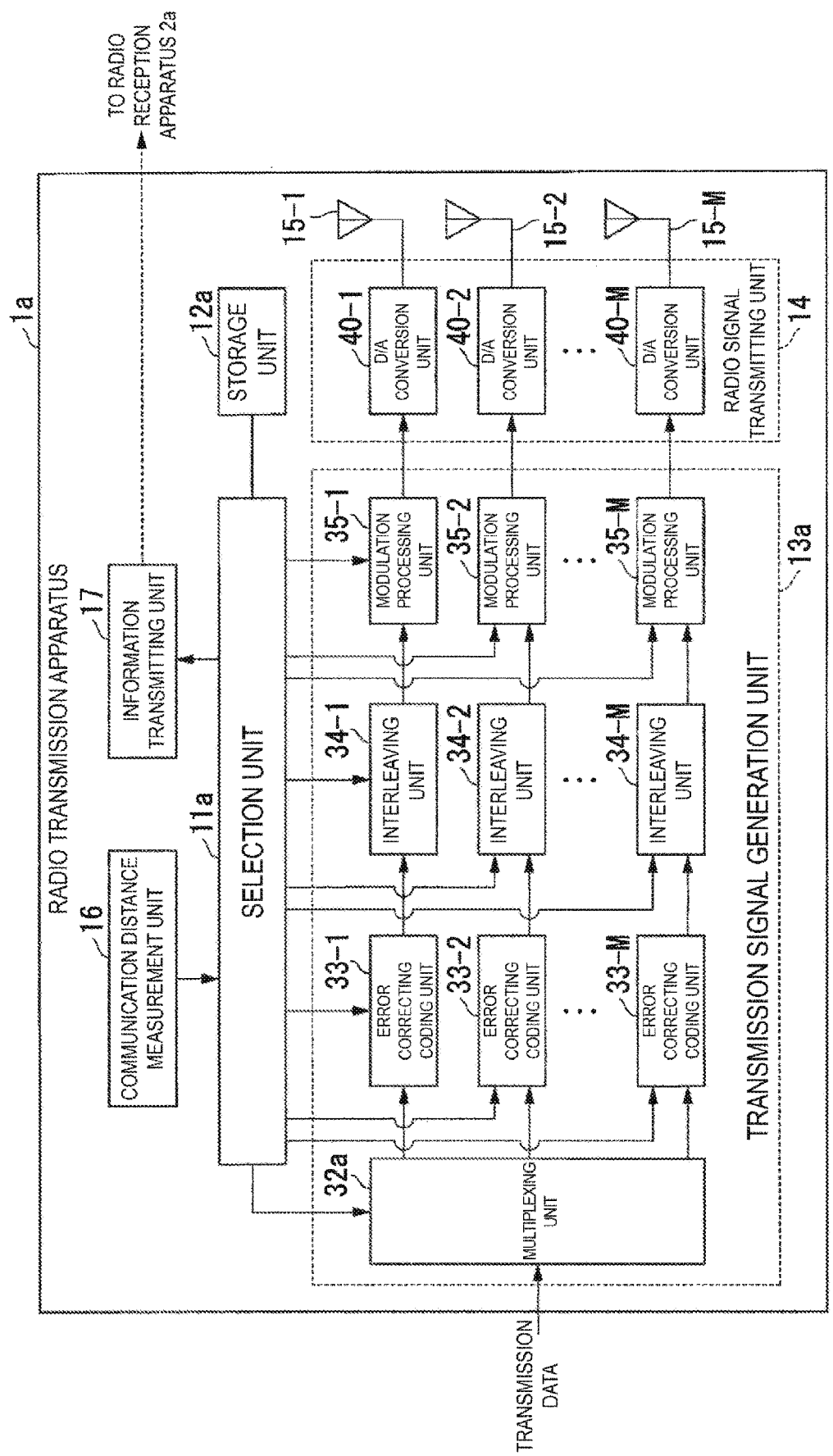
FIG. 8 is a block diagram illustrating a configuration of a radio transmission apparatus according to a second embodiment.
Figure 10:
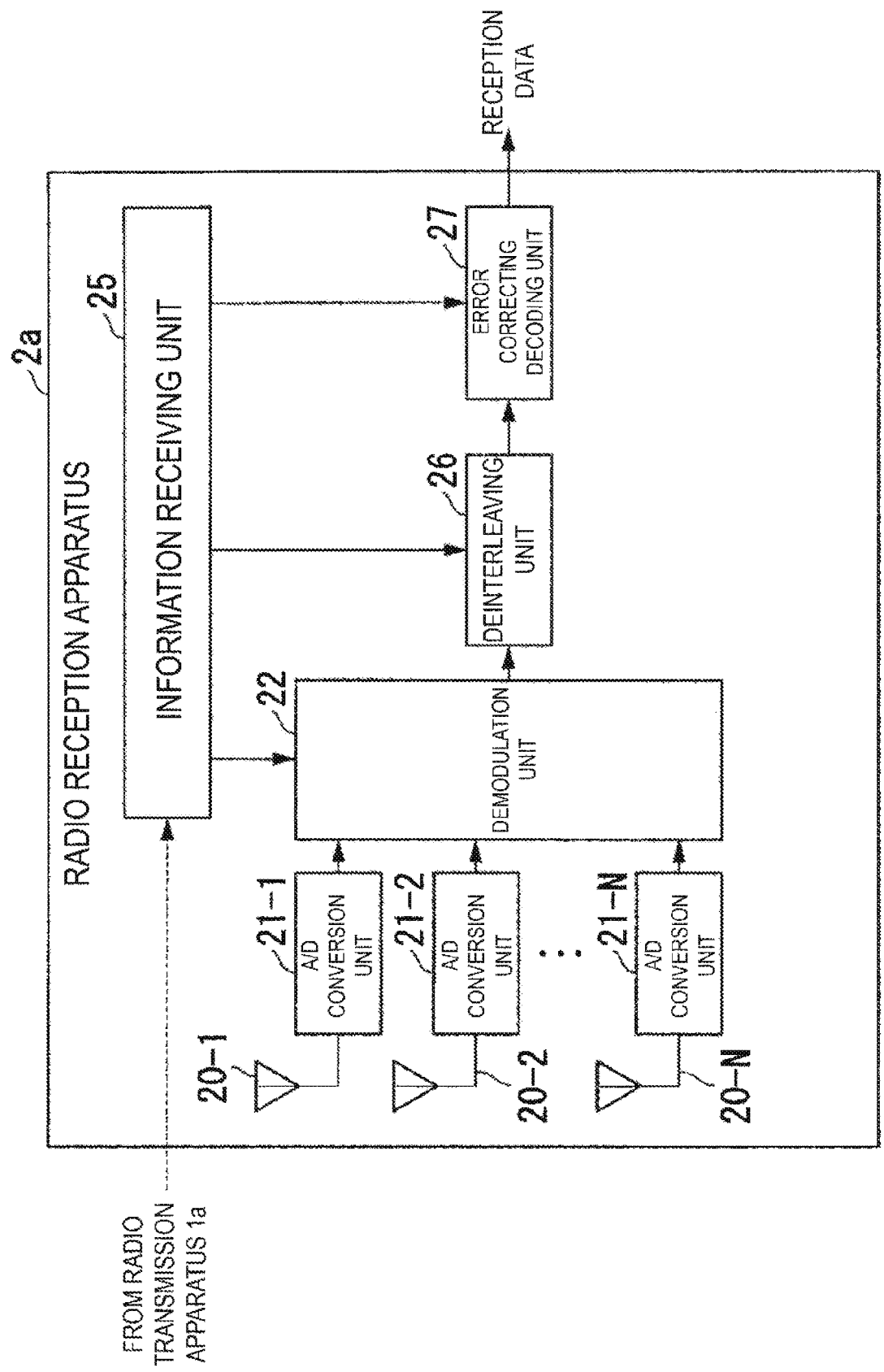
FIG. 10 is a block diagram illustrating a configuration of a radio transmission apparatus according to the second embodiment.

FIG. 8 is a block diagram illustrating a configuration of a radio transmission apparatus 1a of a second embodiment, and FIG. 10 is a block diagram illustrating a configuration of a radio reception apparatus 2a of the second embodiment. For convenience of explanation, a system including the radio transmission apparatus 1a and the radio reception apparatus 2a is referred to as "radio communication system (wireless communication system) Sa". The same components as those of the radio communication system S of the first embodiment are denoted by the same reference signs, and different components will be described below.

Similarly to the first embodiment, the transmission antennas 15-1 to 15-M included in the radio transmission apparatus 1a and the reception antennas 20-1 to 20-N included in the radio reception apparatus 2a are installed to be located in the sea with no obstacles between the transmission antennas 15-1 to 15-M and the reception antennas 20-1 to 20-N, that is, in a line-of-sight environment. A length of an interval between each of the transmission antennas 15-1 to 15-M and a length of an interval between each of the reception antennas 20-1 to 20-N are predetermined. Furthermore, similarly to the first embodiment, radio signals transmitted and received between the transmission antennas 15-1 to 15-M and the reception antennas 20-1 to 20-N are sound wave signals, for example, but may be any signal as long as the signal is a radio signal propagating in the sea.

The radio transmission apparatus 1a includes a selection unit (selector) 11a, a storage unit 12a, a transmission signal generation unit (transmission signal generator) 13a, the radio signal transmitting unit (radio signal transmitter) 14, the transmission antennas 15-1 to 15-M, a communication distance measurement unit (communication distance measurer) 16, and an information transmitting unit 17. The communication distance measurement unit 16 is, for example, a range finder, and measures a distance between the transmission and reception antennas.

Note that although there is a slight difference in distance between each of the transmission antennas 15-1 to 15-M and each of the individual reception antennas 20-1 to 20-N, the distance measured by the communication distance measurement unit 16 is assumed to be a substantially average distance between the transmission and reception antennas.

The storage unit 12a stores a channel capacity table 122 illustrated in FIG. 11. The channel capacity table 122 is a table for storing the channel capacity actually measured for each frequency channel in units of some predetermined distances.

The channel capacity table 122 has a frequency channel value item in a vertical item, followed by an item of "average Ch capacity" and an item of "maximum guaranteed transmission scheme". A value written in the value item of the frequency channel is, for example, a center frequency of the frequency channel, and is written in units of [Hz]. Note that the channel capacity table 122 shows six frequency channels having center frequencies $f_0$ to $f_5$ with L=6, in an example. Note that L=6 is not limiting, and L is an integer of 2 or greater and is a predetermined value.

Furthermore, the channel capacity table 122 has a distance item in a horizontal item. In the distance item, a plurality of predetermined distance values are written in units of [m].

In each element specified by the two items, that is, the item of the frequency channel and the item of the distance, the channel capacity actually measured for each frequency channel and distance is written. Furthermore, in the item of "average Ch capacity", a value of the average channel capacity, that is, an average value of the channel capacity of the frequency channels of $f_0$ to $f_5$ is written for each distance.

In the item of "maximum guaranteed transmission scheme", for the average channel capacity written in the corresponding "Average Ch capacity" item, information indicating the type of transmission scheme allowing the maximum transmission capacity to be achieved within a range of the average channel capacity while satisfying a predetermined desired bit error rate, is written.

The selection unit 11a refers to the channel capacity table 122 and reads the information indicating the type of transmission scheme written in the item of "maximum guaranteed transmission scheme" corresponding to the distance between the transmission and reception antennas measured by the communication distance measurement unit 16. The read transmission scheme is a transmission scheme common to all the frequency channels.

Furthermore, if the common transmission scheme is applied to each of the frequency channels, the selection unit 11a determines whether there is a frequency channel having the bit error rate not satisfying the desired bit error rate by referring to the channel capacity table 122.

Furthermore, the selection unit 11a generates the selection information including the transmission scheme information common to all the frequency channels. When it is determined that there is the frequency channel having the bit error rate not satisfying the desired bit error rate, the selection unit 11a generates the selection information including instruction information indicating execution of error correcting coding and interleaving.

Furthermore, the selection unit 11a outputs the generated selection information to the transmission signal generation unit 13a and the information transmitting unit 17. The information transmitting unit 17 transmits the selection information output by the selection unit 11a to the radio reception apparatus 2a.

The transmission signal generation unit 13a includes a multiplexing unit 32a, error correcting coding units 33-1 to 33-M, interleaving units 34-1 to 34-M, and modulation processing units 35-1 to 35-M.

The multiplexing unit 32a separates the transmission data according to the number of multiplexing indicated in the transmission scheme information included in the selection information output by the selection unit 11a. The multiplexing unit 32a outputs each of the separated transmission data items to the error correcting coding units 33-1 to 33-M.

Each of the error correcting coding units 33-1 to 33-M is connected to the selection unit 11a. If the instruction information is included in the selection information received from the selection unit 11a, the error correcting coding units 33-1 to 33-M perform the same error correcting coding on the separated transmission data items output by the multiplexing unit 32a to each of the error correcting coding units 33-1 to 33-M. A scheme of the error correcting coding is, for example, forward error correcting coding, and is to be predetermined.

Each of the interleaving units 34-1 to 34-M is connected to the selection unit 11a. If the instruction information is included in the selection information received from the selection unit 11a, the interleaving units 34-1 to 34-M perform the same predetermined interleaving on the transmission data output by the corresponding error correcting coding units 33-1 to 33-M.

Figure 9:
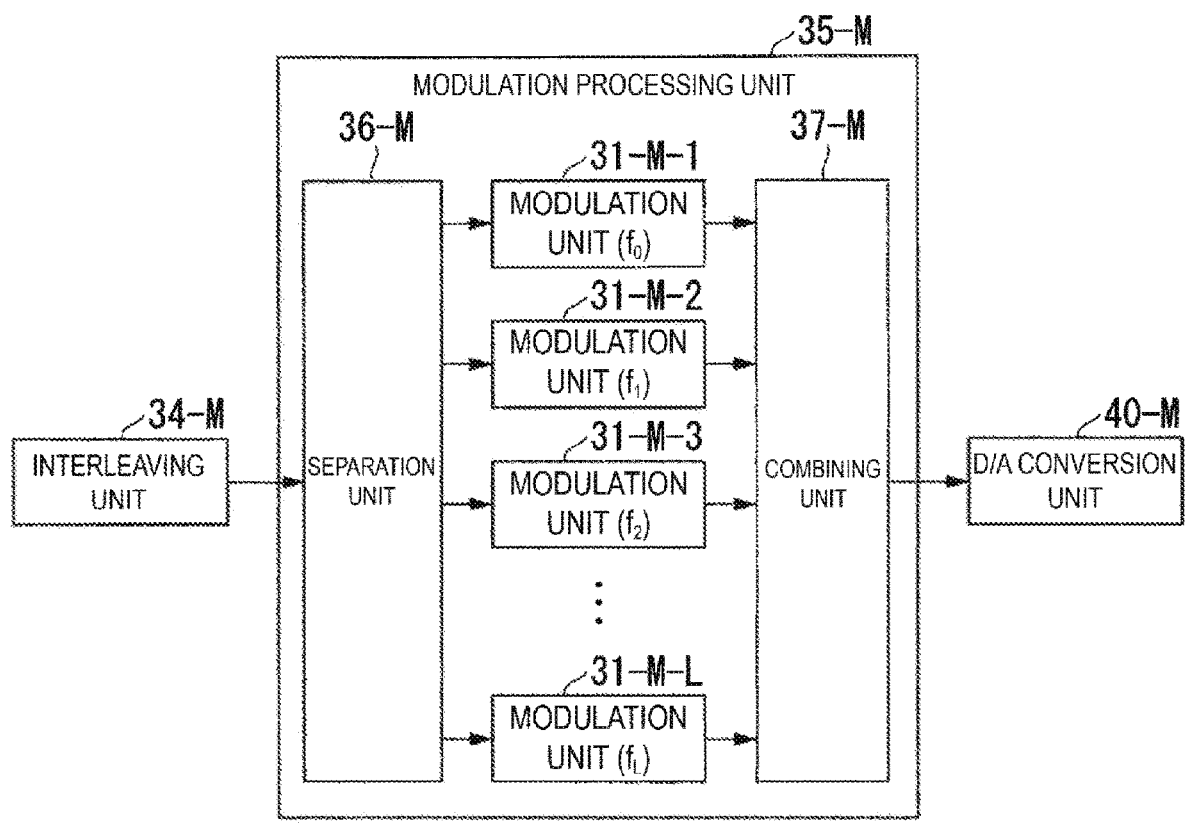
FIG. 9 is a block diagram illustrating an internal configuration of a modulation processing unit and a connection relationship between an interleaving unit and a D/A conversion unit according to the second embodiment.

The modulation processing units 35-1 to 35-M have a similar internal configuration. For example, FIG. 9 illustrates, in an example, the internal configuration of the modulation processing unit 35-M and a connection relationship between the interleaving unit 34-M and the D/A conversion unit 40-M. The modulation processing unit 35-M includes a separation unit 36-M, L modulation units 31-M-1 to 31-M-L, and a combining unit 37-M. Note that the internal configurations of the modulation processing units 35-1 to 35-(M-1) is such that the reference numerals M in FIG. 9 are replaced with 1 to (M-1), respectively.

Here, L is an integer of 2 or greater as in the first embodiment. In the first embodiment, the plurality of frequency channels to be used are selected from all the frequency channels available in the sea, and thus, L may be less than the number of all the frequency channels available in the sea. On the other hand, in the second embodiment, all the frequency channels available in the sea are used, and thus, L matches the number of all frequency channels available in the sea. Note that the number of all the frequency channels available in the sea is to be predetermined.

The separation unit 36-M separates the transmission data output by the interleaving unit 34-M into L. The separation unit 36-M outputs each of the separated transmission data items to each of the modulation units 31-M-1 to 31-M-L.

Each of the modulation units 31-M-1 to 31-M-L is previously set with the center frequency of each of the different frequency channels, as the modulation frequency. For example, the modulation unit 31-M-1 is set with a frequency $f_0$, and the modulation unit 31-M-L is set with a frequency $f_L$. The modulation units 31-M-1 to 31-M-L modulate the transmission data output by the separation unit 36-M to each of the modulation units 31-M-1 to 31-M-L, according to the modulation scheme common to all the frequency channels indicated in the transmission scheme information included in the selection information output by the selection unit 11a and the predetermined modulation frequency to generate the transmission signal.

The combining unit 37-M combines the transmission signals generated and output by each of the modulation units 31-M-1 to 31-M-L to output the combined transmission signal to the D/A conversion unit 40-M.

The radio reception apparatus 2a illustrated in FIG. 10 includes the reception antennas 20-1 to 20-N, the A/D conversion units 21-1 to 21-N, the demodulation unit (demodulator) 22, an information receiving unit 25, a deinterleaving unit 26, and an error correcting decoding unit 27.

The information receiving unit 25 receives the selection information transmitted by the information transmitting unit 17 of the radio transmission apparatus 1a. The information receiving unit 25 outputs the received selection information to the demodulation unit 22, the deinterleaving unit 26, and the error correcting decoding unit 27. Note that the transmission capacity needed for transmitting the information from the information transmitting unit 17 to the information receiving unit 25 may be a small transmission capacity. Furthermore, the communication between the information transmitting unit 17 and the information receiving unit 25 is performed by, for example, radio communication via a sea with good communication quality, or radio communication of electromagnetic waves propagating in an air with good communication quality.

If the instruction information is included in the selection information output by the information receiving unit 25, the deinterleaving unit 26 performs deinterleaving on the reception data output by the demodulation unit 22. Here, a deinterleaving scheme is a deinterleaving scheme corresponding to the interleaving scheme performed by the interleaving units 34-1 to 34-M, and is assumed to be predetermined.

If the instruction information is included in the selection information output by the information receiving unit 25, the error correcting decoding unit 27 performs error correcting decoding on the reception data output by the deinterleaving unit 26. Here, the error correcting decoding scheme is an error correcting decoding scheme corresponding to the error correcting coding scheme performed by the error correcting coding units 33-1 to 33-L, and is assumed to be predetermined.

Processing of Radio Communication System According to Second Embodiment

Figure 12:
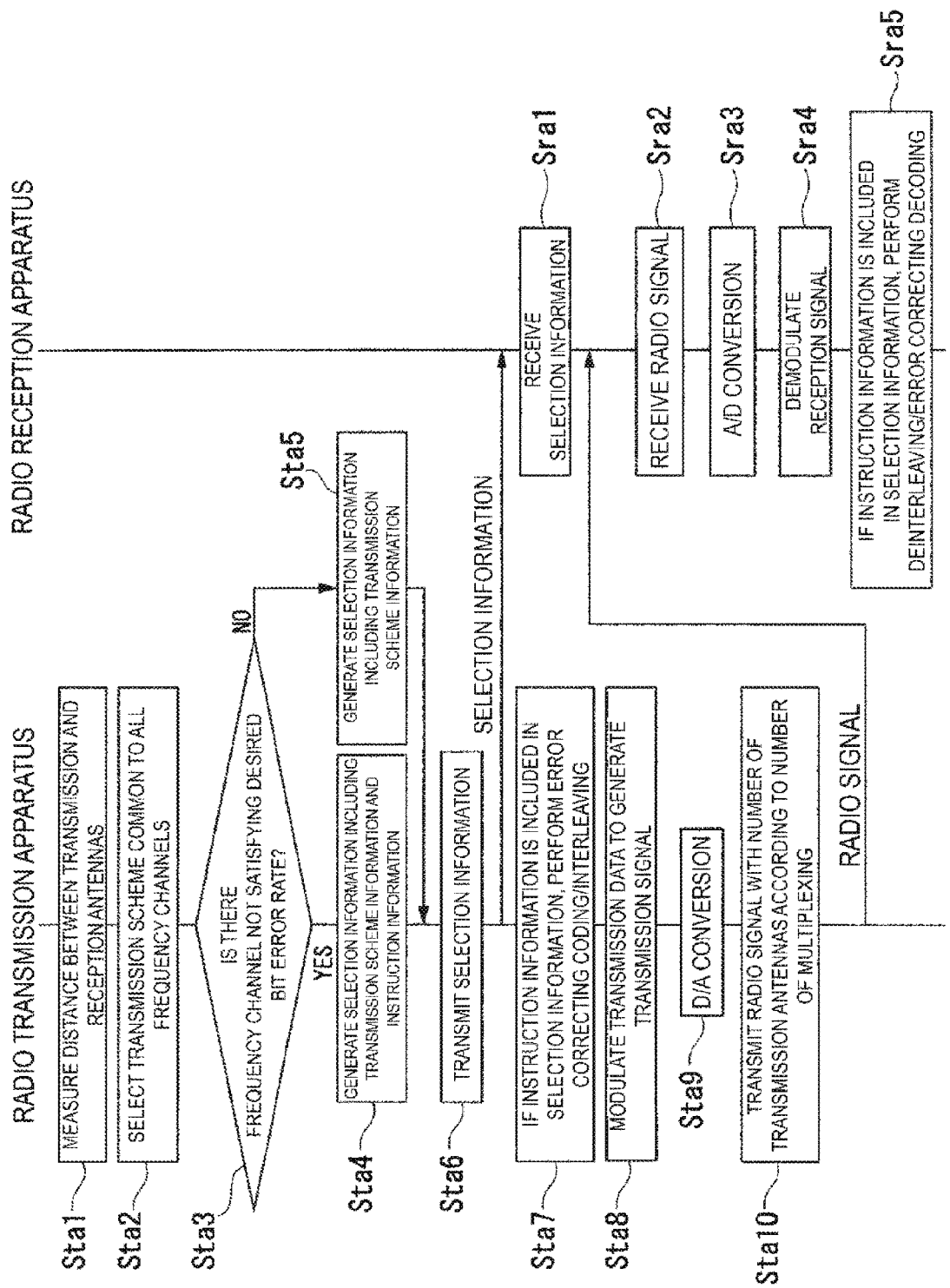
FIG. 12 is a sequence diagram illustrating a flow of processes by the radio communication system according to the second embodiment.

FIG. 12 is a sequence diagram illustrating a flow of processes of the radio communication system Sa according to the second embodiment. Note that the description proceeds below assuming that the number L of all the frequency channels is 6. Furthermore, the following describes a process where the selection unit 11a utilizes the channel capacity table 122 instead of calculating the channel capacity for each frequency channel to calculate the average channel capacity, that is, the average value of the channel capacity.

The communication distance measurement unit 16 measures the distance between the transmission and reception antennas (step Sta1). Here, it is assumed that the distance between the transmission and reception antennas measured by the communication distance measurement unit 16 is "$X_3$". The communication distance measurement unit 16 outputs the measured distance information between the transmission and reception antennas to the selection unit 11a.

The selection unit 11a refers to the channel capacity table 122 stored in the storage unit 12a, and reads the information indicating the type of transmission scheme written in the item of "maximum guaranteed transmission scheme" corresponding to the distance between the transmission and reception antennas output by the communication distance measurement unit 16. Here, as illustrated in FIG. 11, the selection unit 11a reads the transmission scheme B and selects the read transmission scheme B as the transmission scheme common to all the frequency channels (step Sta2).

The selection unit 11a reads out the transmission scheme information corresponding to the selected transmission scheme B from the storage unit 12a. Here, it is assumed that the number of multiplexing included in the transmission scheme information of the transmission scheme B is "M".

The selection unit 11a refers to a transmission scheme lookup table 121a-1 to determine, with reference to the channel capacity table 122, whether there is a frequency channel with the bit error rate not satisfying the desired bit error rate, in each of the frequency channels of the selected transmission scheme B (step Sta3).

If the selection unit 11a determines that there is a frequency channel with the bit error rate not satisfying the desired bit error rate (Yes in step Sta3), the selection unit 11a generates the selection information including the read transmission scheme information and the instruction information (step Sta4). On the other hand, if the selection unit 11a determines that there is no frequency channel with the bit error rate not satisfying the desired bit error rate (No in step Sta3), the selection unit 11a generates the selection information including the read transmission scheme information (step Sta5).

The selection unit 11a reads a value of the average channel capacity "8.7" in the item of "average Ch capacity" of the distance $X_3$ of the channel capacity table 122. If the selection unit 11a determines that there is a value less than "8.7", out of the values of the channel capacity of each item of the frequency channels "$f_0$" to "$f_5$" of the distance $X_3$ of the channel capacity table 122, the selection unit 11a determines in step Sta3 that there is the frequency channel with the bit error rate not satisfying the desired bit error rate. On the other hand, if there is no value less than "8.7", out of the values of the channel capacity of each item of the frequency channels "$f_0$" to "$f_5$" of the distance $X_3$ of the channel capacity table 122, the selection unit 11a determines in step Sta3 that there is no frequency channel with the bit error rate not satisfying the desired bit error rate. Here, as illustrated in FIG. 11, the values of the channel capacity of the frequency channels $f_0$ and $f_5$ are less than "8.7", and thus, the selection unit 11a determines that there is the frequency channel with the bit error rate not satisfying the desired bit error rate. Thus, the selection unit 11a generates the selection information including the read transmission scheme information of the transmission scheme B and the instruction information (step Sta4).

The selection unit 11a outputs the generated selection information to the transmission signal generation unit 13a and the information transmitting unit 17. The information transmitting unit 17 transmits the selection information to the information receiving unit 25 of the radio reception apparatus 2a (step Sta6).

The information receiving unit 25 receives the selection information transmitted by the information transmitting unit 17. The information receiving unit 25 outputs the received selection information to the demodulation unit 22, the deinterleaving unit 26, and the error correcting decoding unit 27. The demodulation unit 22 of the radio reception apparatus 2 captures the selection information output by the information receiving unit 25, and sets the demodulation scheme corresponding to the modulation scheme common to all the frequency channels included in the selection information (step Sra1).

The multiplexing unit 32a separates the transmission data into M according to the number of multiplexing "M" indicated in the transmission scheme information included in the selection information output by the selection unit 11a. The multiplexing unit 32a outputs each of the M separated transmission data items to the error correcting coding units 33-1 to 33-M.

If the instruction information is included in the selection information received from the selection unit 11a, the error correcting coding units 33-1 to 33-M perform the same predetermined error correcting coding on the transmission data output by the multiplexing unit 32a. If the instruction information is not included in the selection information, the error correcting coding units 33-1 to 33-M directly output the transmission data output by the multiplexing unit 32a. Here, the instruction information is included in the selection information, and thus, the error correcting coding units 33-1 to 33-M perform the error correcting coding on the transmission data.

If the instruction information is included in the selection information received from the selection unit 11a, the interleaving units 34-1 to 34-M perform the same predetermined interleaving on the transmission data output by the corresponding error correcting coding units 33-1 to 33-M. If the instruction information is not included in the selection information, the interleaving units 34-1 to 34-M directly output the transmission data output by the corresponding error correcting coding units 33-1 to 33-M. Here, the instruction information is included in the selection information, and thus, the interleaving units 34-1 to 34-M perform the interleaving on the transmission data (step Sta7).

The modulation processing units 35-1 to 35-M capture the transmission data output by the corresponding interleaving units 34-1 to 34-M. For example, in the case of the modulation processing unit 35-M, the separation unit 36-M captures the transmission data output by the interleaving unit 34-M, and separates the captured transmission data into L. Each of the modulation units 31-M-1 to 31-M-L modulates the transmission data according to the modulation scheme of the transmission scheme B common to all the frequency channels included in the selection information received from the selection unit 11a and with modulation frequencies $f_0$ to $f_5$ predetermined for each of the modulation units 31-M-1 to 31-M-L. The combining unit 37-M captures the transmission data modulated and output by each of the modulation units 31-M-1 to 31-M-L, combines the captured transmission data to output the combined data to the D/A conversion unit 40-M (step Sta8). Similar processes to those in the modulation processing unit 35-M are performed in the modulation processing units 35-1 to 35-(M-1).

Each of the D/A conversion units 40-1 to 40-M converts the digital transmission signals output by the corresponding modulation processing units 35-1 to 35-M into the analog transmission signals (step Sta9). The D/A conversion units 40-1 to 40-M transmit the converted analog transmission signals to the radio reception apparatus 2a through the transmission antennas 15-1 to 15-M (step Sta10).

The reception antennas 20-1 to 20-N receive the radio signals transmitted by the radio transmission apparatus 1 and output the received signals as reception signals (step Sra2). The A/D conversion units 21-1 to 21-N convert the analog reception signals output by the reception antennas 20-1 to 20-N connected with the A/D conversion units 21-1 to 21-N, respectively, into digital reception signals (step Sra3).

The demodulation unit 22 captures the digital reception signals output by the A/D conversion units 21-1 to 21-N, demodulates the captured reception signals with the demodulation scheme set in step Sra1 to generate the reception data. The demodulation unit 22 outputs the generated reception data to the deinterleaving unit 26 (step Sra4).

In step Sra1, if the instruction information is included in the selection information received from the information receiving unit 25, the deinterleaving unit 26 performs predetermined deinterleaving on the reception data output by the demodulation unit 22 to output the deinterleaved data. If the instruction information is not included in the selection information, the deinterleaving unit 26 directly outputs the reception data output by the demodulation unit 22. Here, the instruction information is included in the selection information, and thus, the deinterleaving unit 26 performs the deinterleaving on the reception data output by the demodulation unit 22 to output the deinterleaved data.

In step Sra1, if the instruction information is included in the selection information received from the information receiving unit 25, the error correcting decoding unit 27 performs the predetermined error correcting decoding on the reception data output by the deinterleaving unit 26 to output the decoded data. If the instruction information is not included in the selection information, the error correcting decoding unit 27 directly outputs the reception data output by the deinterleaving unit 26. Here, the instruction information is included in the selection information, and thus, the error correcting decoding unit 27 performs the error correcting decoding on the reception data output by the deinterleaving unit 26 to output the decoded data.

The radio transmission apparatus 1a repeats the processes of steps Sta1 to Sta10, and the radio reception apparatus 2a repeats the processes of steps Sra1 to Sra5. As a result, even if a ship equipped with the radio transmission apparatus 1a and a ship equipped with the radio reception apparatus 2a move in any direction to change the distance between the transmission and reception antennas, the communication distance measurement unit 16 of the radio transmission apparatus 1a continues to measure the distance between the transmission and reception antennas. This enables the selection unit 11a of the radio transmission apparatus 1a to select an appropriate transmission scheme common to all the frequency channels according to the distance between the transmission and reception antennas.

Note that in the process of step Sta3 illustrated in FIG. 12, the selection unit 11a determines whether there is a frequency channel not satisfying the desired bit error rate, based on the value of the average channel capacity in the item of "average Ch capacitance" in the channel capacity table 122. Thus, based on the average value, unless the channel capacity values of all the frequency channels are the same, there are frequency channels not satisfying the desired bit error rate, and the error correcting coding and the interleaving are to be performed. If the frequency of occurrence of processing of the error correcting coding and the interleaving is to be suppressed, for example, the selection unit 11a may use, as a reference determination value, a value obtained by subtracting a certain value from the average channel capacity rather than using the value of the average channel capacity as the reference determination value.

In the configuration of the second embodiment described above, the radio transmission apparatus 1a includes the communication distance measurement unit 16 that measures the distance between the transmission and reception antennas. The selection unit 11a of the radio transmission apparatus 1a selects the average channel capacity obtained by averaging the channel capacity for each frequency channel indicating the orthogonality between the transmission antennas 15-1 to 15-N and the reception antennas 20-1 to 20-N, according to the distance between the transmission and reception antennas measured by the communication distance measurement unit 16 and the modulation scheme common to all the frequency channels satisfying the predetermined desired bit error rate. The transmission signal generation unit 13a separates the transmission data into the number of all the frequency channels. Next, the transmission signal generation unit 13a modulates each of the separated transmission data items by the selected common modulation scheme to output a transmission signal multiplexed by the number of multiplexing.

As a result, in the radio communication system Sa of the second embodiment, all the frequency channels are used, and thus, even if the distance between the transmission and reception antennas changes in a line-of-sight environment, it is possible to maintain the formation of parallel transmission lines in the spatial multiplex transmission to increase the transmission capacity. Furthermore, the second embodiment is configured so that unlike in the first embodiment, the radio transmission apparatus 1a does not receive the estimation information including the distance between the transmission and reception antennas and the angle of the arrival direction of the radio signal from a reception side, but the radio transmission apparatus 1a measures by itself the distance between the transmission and reception antennas. This eliminates a time period required for estimating the estimation information and a time period required for transmitting the estimated information. Furthermore, instead of these time periods, only a time period for the communication distance measurement unit 16 to measure the distance is required, and thus, it is possible to shorten a time period for transmitting the radio signal when the distance between the transmission and reception antennas changes.

Furthermore, the selection unit 11a of the radio transmission apparatus 1a does not select the frequency channel to be used, but all the frequency channels are used, and therefore, the degree of averaging the characteristics of the channel capacity different depending on each frequency channel is increased than in the first embodiment. Furthermore, the transmission scheme common to all the frequency channels is selected, and thus, it is possible to shorten a time period required for selecting the transmission scheme. However, in the second embodiment, the transmission scheme common to all the frequency channels is selected. Thus, the available channel capacity may be smaller than that of the radio communication system S of the first embodiment.

Furthermore, in the second embodiment, all the frequency channels are used and the transmission scheme common to all the frequency channels are applied, and thus, the optimum transmission scheme is not applied to each frequency channel. Thus, a frequency channel with the bit error rate not satisfying the desired bit error rate may be generated. For such a frequency channel, redundancy may be added by the error correcting coding performed by the error correcting coding units 33-1 to 33-L, and generation of a burst error may be prevented by the interleaving performed by the interleaving units 34-1 to 34-L to compensate for the bit error rate. Thus, even with the configuration of the second embodiment, it is possible to perform the radio communication with a high channel capacity.

Figure 13:
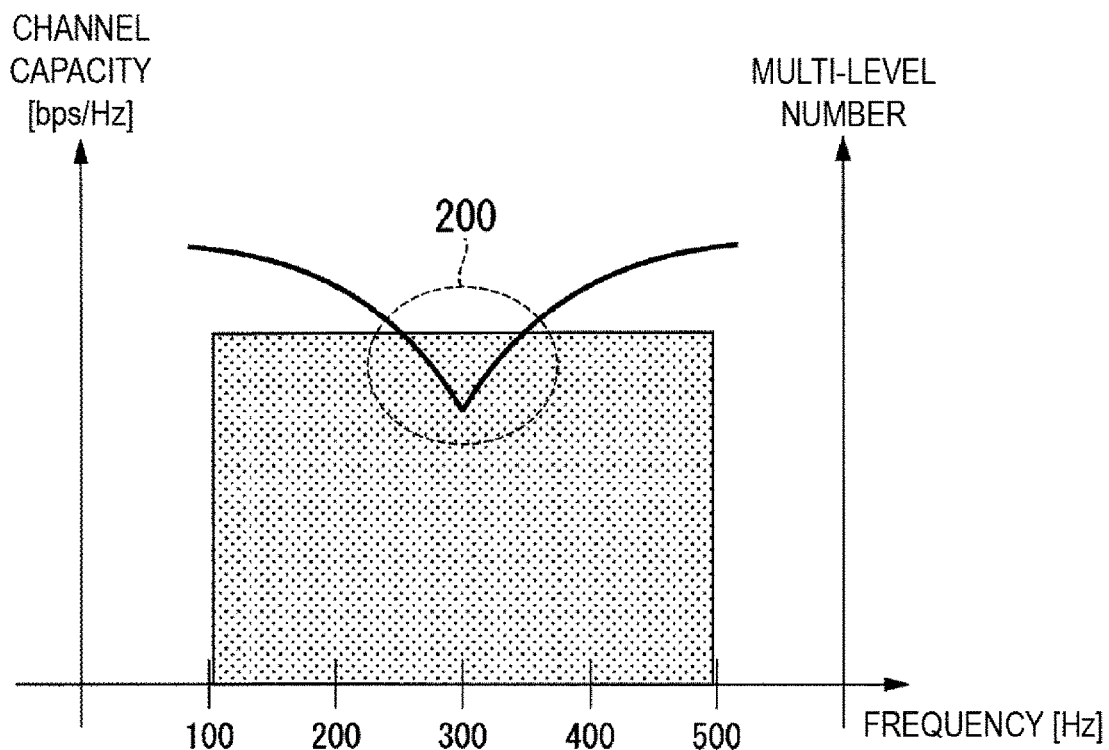
FIG. 13 is a graph showing a relationship between a channel capacity and a multi-level number for each frequency channel when a common transmission scheme is assigned to all frequency channels in the second embodiment (part 1).
Figure 14:
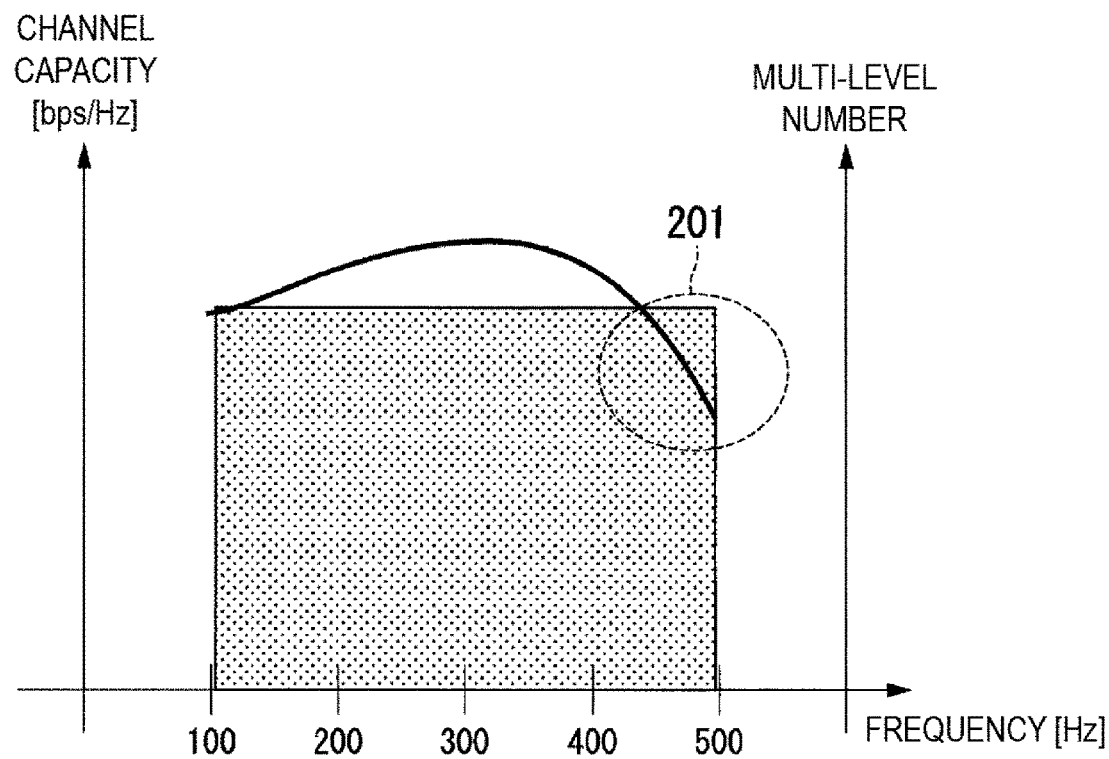
FIG. 14 is a graph showing a relationship between a channel capacity and a multi-level number for each frequency channel when a common transmission scheme is assigned to all frequency channels in the second embodiment (part 2).

For example, FIG. 13 is a graph showing a relationship between a channel capacity for each frequency channel when the distance between the transmission and reception antennas is "10 m" and the multi-level number in a modulation scheme. Furthermore, FIG. 14 is a graph showing a relationship between a channel capacity for each frequency channel when the distance between the transmission and reception antennas is "15 m" and the multi-level number in a modulation scheme. In FIGS. 13 and 14, a horizontal axis represents a frequency value.

In FIGS. 13 and 14, a change characteristic indicated by the solid line shows a change of the channel capacity, and the bar graph shows the multi-level number. In the second embodiment, the common transmission scheme is applied to all the frequency channels, and thus, the multi-level number is the same for all the frequency channels.

The change characteristic of the channel capacity in the graph of FIG. 13 reveals that the frequencies near "100 Hz" and "500 Hz" at both the ends have a high channel capacity. Compared with FIG. 4 shown in the first embodiment, in the second embodiment, the frequencies around "100 Hz" and "500 Hz" at both the ends do not have appropriate multi-level number, and thus, there are available channel capacities.

In FIG. 13, the channel capacity is low near the center of the frequency at "300 Hz" indicated by reference numeral 200. Thus, in the frequency channel in a portion indicated by the reference numeral 200, the bit error rate is high, and thus, compensation by the error correcting coding and the interleaving may be provided to decrease the overall bit error rate of the transmission data for compensation.

The change characteristic of the channel capacity in the graph of FIG. 14 reveals that the frequencies near "300 Hz" have a high channel capacity. Compared with FIG. 5 shown in the first embodiment, in the second embodiment, the appropriate multi-level number is not achieved around the frequency "300 Hz", and thus, there are available channel capacities.

In FIG. 14, the channel capacity is greatly reduced near "500 Hz" indicated by reference numeral 201. Thus, in the frequency channel in a portion indicated by the reference numeral 201, the bit error rate is high, and thus, compensation by the error correcting coding and the interleaving may be provided to decrease the overall bit error rate of the transmission data for compensation.

Figure 15:
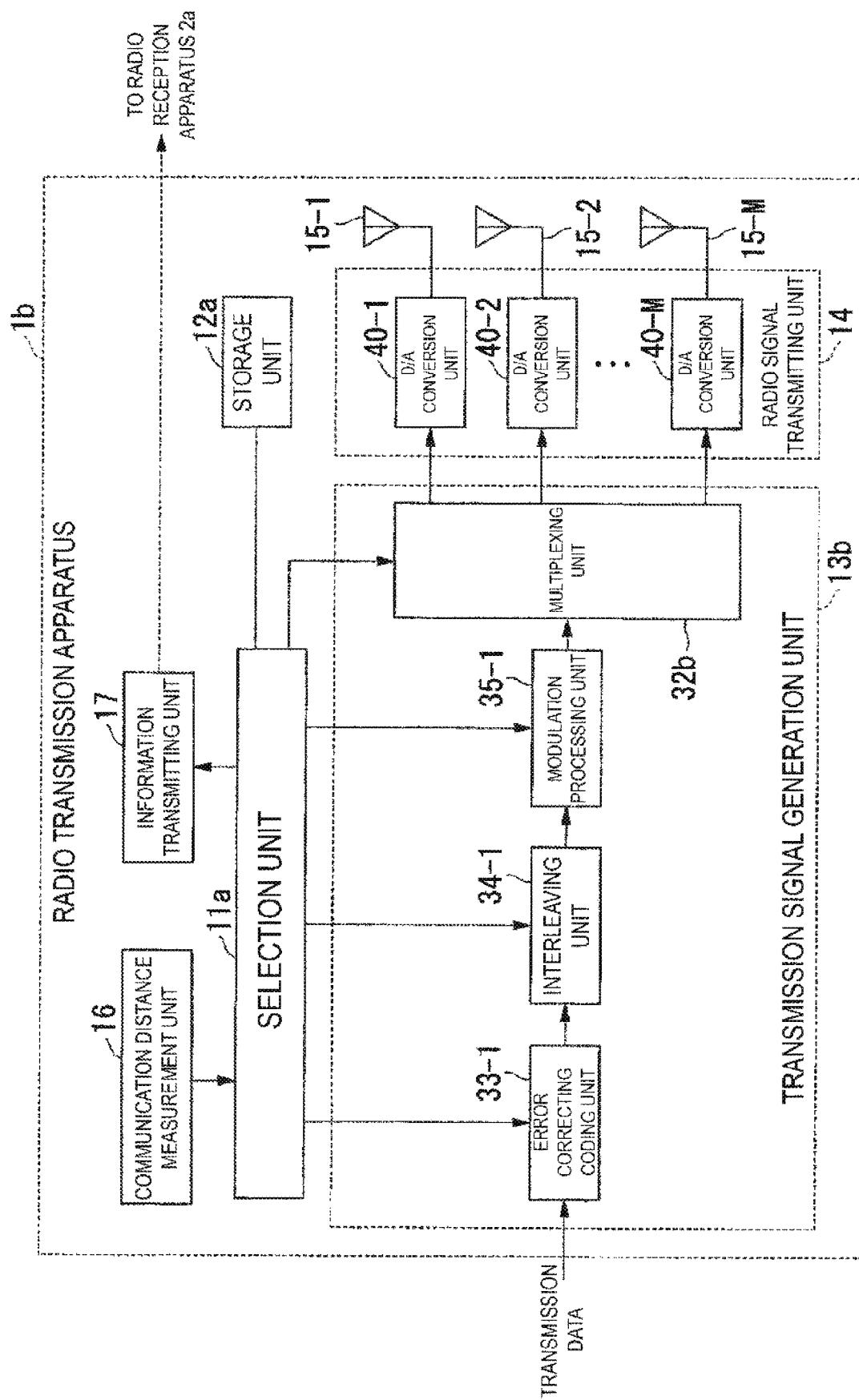
FIG. 15 is a block diagram illustrating another example of a configuration of the radio transmission apparatus according to the second embodiment.
Figure 16:
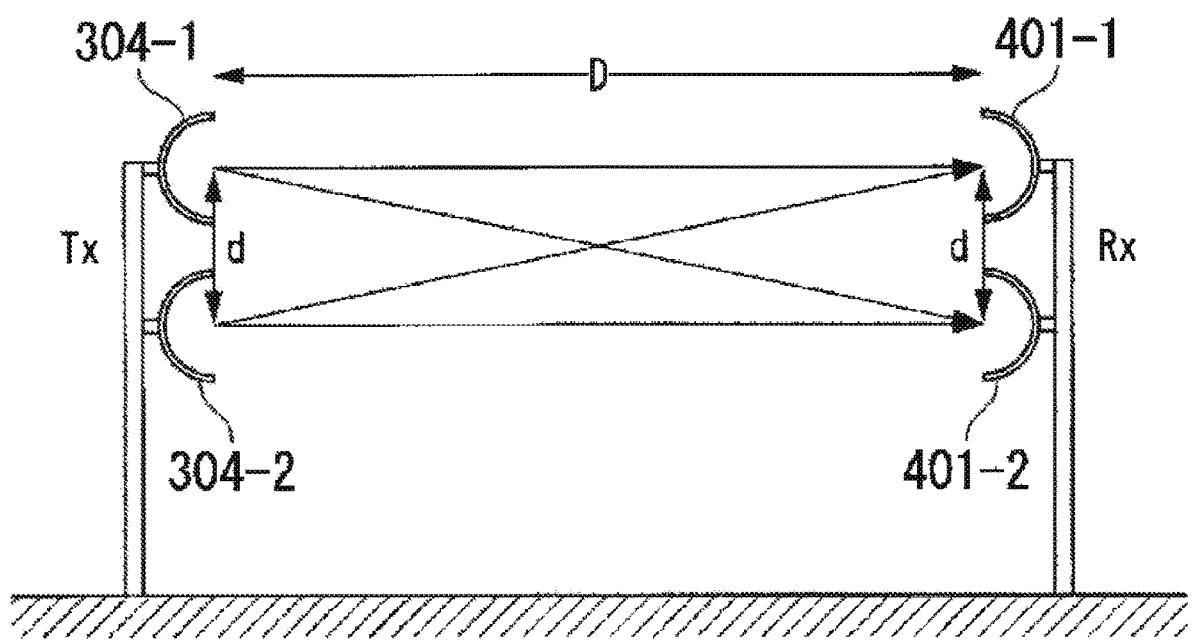
FIG. 16 is a diagram illustrating a geometrical configuration of a transmission antenna and a reception antenna in the LoS-MIMO technology.
Figure 17:
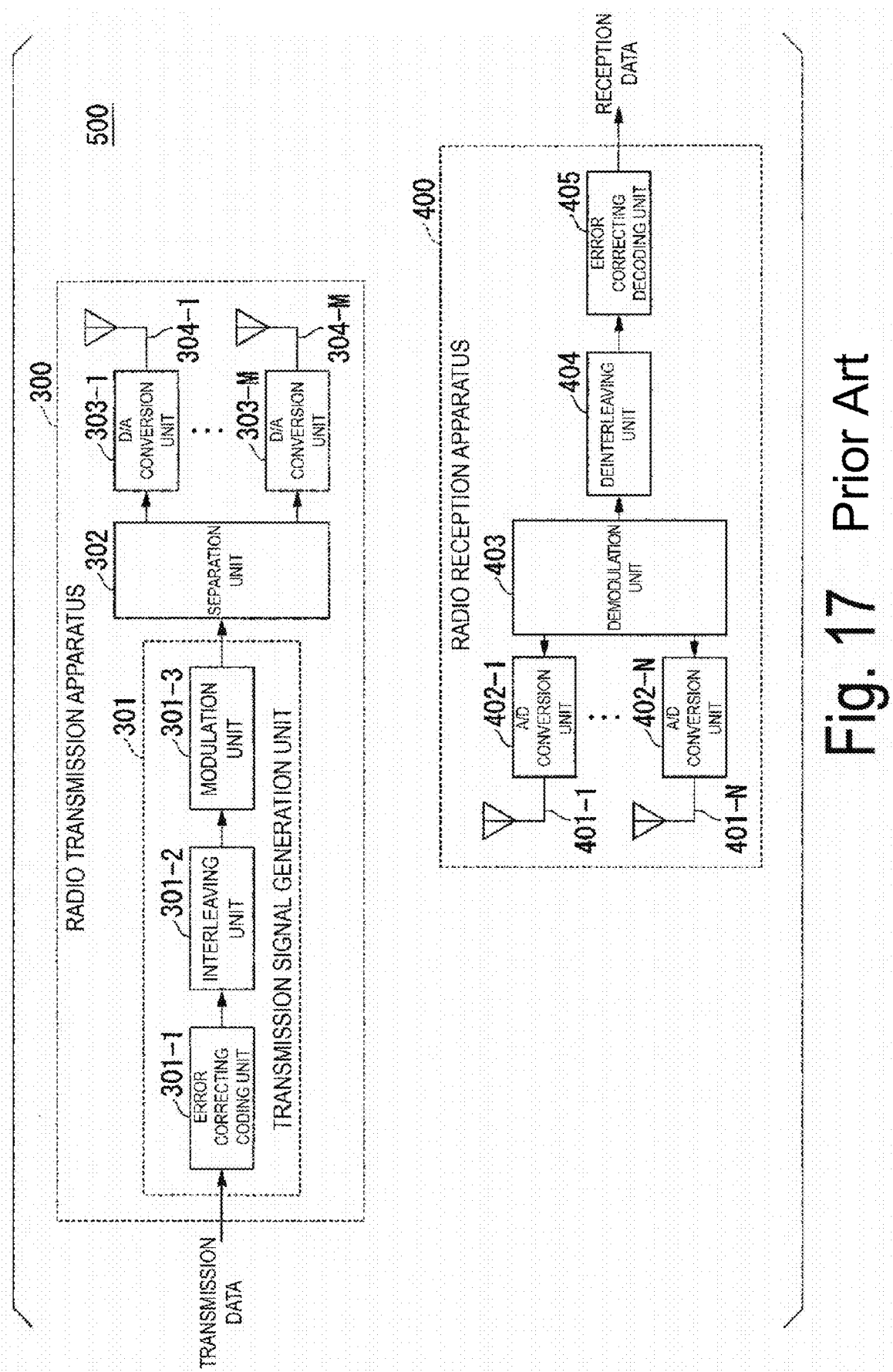
FIG. 17 is a block diagram illustrating a configuration of a known radio communication system using the LoS-MIMO technology.
Figure 18:
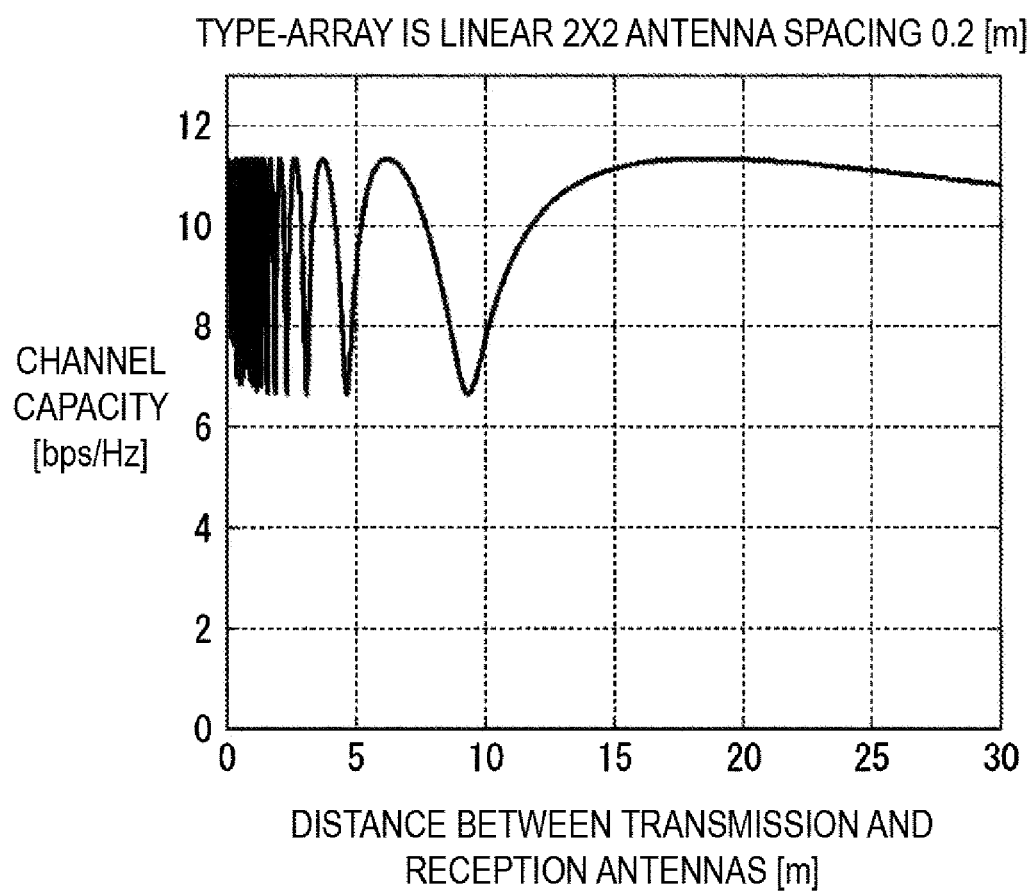
FIG. 18 is a graph showing a distance characteristic of a channel capacity when the LoS-MIMO technology is used.

Note that, in another example of the configuration of the second embodiment, a radio transmission apparatus 1b illustrated in FIG. 15 may be applied instead of the radio transmission apparatus 1a of the second embodiment. The transmission signal generation unit 13b of the radio transmission apparatus 1b includes the error correcting coding unit 33-1, the interleaving unit 34-1, the modulation processing unit 35-1, and a multiplexing unit 32b. The transmission signal generation unit 13b performs error correcting coding, interleaving, and modulation for all the frequency channels on the transmission data, according to the selection information output by the selection unit 11a, and thereafter, the multiplexing unit 32b separates the transmission signal according to the number of multiplexing included in the selection information and outputs each of the separated transmission signals to the D/A conversion units 40-1 to 40-M. Note that the error correcting coding and the interleaving are performed when the instruction information is included in the selection information, and are not performed when the instruction information is not included in the selection information.

Furthermore, also in the second embodiment described above, as in the first embodiment, if the number of multiplexing included in the transmission scheme information is a value smaller than M that is the number of transmission antennas 15-1 to 15-M, the combination of transmission antennas 15-1 to 15-M used for transmitting the radio signal is to be predetermined. For example, when the number of multiplexing is "2", the use of transmission antennas at both ends having the widest spacing therebetween and allowing streams of each radio signal to be easily independent, in other words, the use of the transmission antenna 15-1 and the transmission antenna 15-M is predetermined. Information on the combination of transmission antennas 15-1 to 15-M according to the number of multiplexing is previously stored in a storage area inside the multiplexing units 32a and 32b, and the multiplexing units 32a and 32b select an output destination according to the number of multiplexing. In the case of the multiplexing unit 32a, when the number of multiplexing is "2", the multiplexing unit 32a outputs the separated transmission data to the error correcting coding units 33-1 and 33-M. In the case of the multiplexing unit 32b, when the number of multiplexing is "2", the multiplexing unit 32b outputs the separated transmission data to the D/A conversion units 40-1 and 40-M.

Furthermore, in the second embodiment described above, if the instruction information is included in the selection information generated by the selection unit 11a, both the error correcting coding and the interleaving are performed. However, in the second embodiment, only one of the error correcting coding and the interleaving may be performed. In this case, another instruction information in which the instruction information for the error correcting coding units 33-1 to 33-M and the instruction information for the interleaving units 34-1 to 34-M can be distinguished may be included in the selection information. Furthermore, information indicating the type of scheme of the error correcting coding and the type of scheme of the interleaving may be included in the instruction information. In this manner, the error correcting coding units 33-1 to 33-M and the interleaving units 34-1 to 34-M receiving the instruction information, the error correcting decoding unit 27, and the deinterleaving unit 26 can perform the process by switching the schemes based on the instruction information.

Furthermore, in the second embodiment described above, the value of the channel capacity of the channel capacity table 122 is an actually measured value; however, the selection unit 11a may calculate the channel capacity according to Equations (2) to (6) indicated in the first embodiment to select the transmission scheme in consideration of the desired bit error rate. In this case, the selection unit 11a calculates the channel capacity for each frequency channel from the distance measured by the communication distance measurement unit 16 and the SNR evaluated from the transmission power when the radio transmission apparatus 1a performs transmission. The selection unit 11a calculates the average channel capacity that is the average value of the calculated channel capacities, and selects the transmission scheme satisfying the calculated average channel capacity and the desired bit error rate and providing a closest transmission rate, as the transmission scheme common to all the frequency channels.

Furthermore, in the first embodiment described above, the radio transmission apparatus 1 may not need to use the both information of the "distance" and the "angle" but may be configured to perform control by using the estimation information including the "distance" only. If the radio transmission apparatus 1 is thus configured, the radio transmission apparatus 1 uses a lookup table of the angle "0 degree" in the transmission scheme lookup table 121 illustrated in FIG. 2 to select the transmission scheme. With this configuration, although the accuracy is deteriorated compared to the case where the "angle" information is used, the control is performed on the entire channel instead of the control for each channel, and thus, the accuracy can be compensated by the interleaving.

Furthermore, in the first and second embodiments described above, M=2 is established, and if the radio transmission apparatuses 1 and 1a include only the two transmission antennas, that is, the transmit antennas 15-1 and the transmit antenna 15-2, the number of multiplexing is fixed at "2". In this case, the multiplexing units 32, 32a, and 32b are to separate all the transmission signals into two, and thus, the number of multiplexing is not included in the transmission scheme information.

Furthermore, in the above-mentioned first and second embodiments, in the description indicated by using the first to third transmission rate thresholds, the first and second bit error rate thresholds, and the channel capacity threshold value, discrimination is performed by using an inequality sign or an inequality sign with an equal sign. However, the present invention is not limited to those embodiments, and discrimination as to "whether or not a value is greater than a threshold", "whether or not a value is less than a threshold", "whether or not a value is equal to or greater than a threshold", and "whether or not a value is equal to or less than a threshold" is merely an example. Depending on how a threshold is set, the above discrimination may be respectively replaced by "whether or not a value is equal to or greater than a threshold", "whether or not a value is equal to or less than a threshold", "whether or not a value is greater than a threshold", and "whether or not a value is less than a threshold". For example, the discrimination as to whether the "desired bit error rate" at step St2 of FIG. 3 in the first embodiment is satisfied is performed depending on whether the desired bit error rate is the bit error rate less than the first bit error rate threshold, but when the value of the first bit error rate threshold is changed, it may be interpreted that the discrimination is performed depending on whether the desired bit error rate is the bit error rate equal to or less than the first bit error rate threshold. The threshold used for the discrimination is also merely an example, and a different threshold may be used for each discrimination.

Furthermore, in the first and second embodiments described above, the channel capacity is used as the index value indicating the orthogonality, but any value other than the channel capacity may be used as long as the value is an index value indicating the orthogonality.

The radio transmission apparatuses 1, 1a, and 1b and the radio reception apparatuses 2 and 2a in the above-described embodiments may be realized by a computer. In this case, a program for realizing their functions may be recorded on a computer-readable recording medium and the program recorded on the recording medium may be read and executed by a computer system to realize the functions. Note that the "computer system" as used herein includes an OS and hardware such as a peripheral device. In addition, the "computer-readable recording medium" refers to a portable medium such as a flexible disk, a magneto-optical disk, a read only memory (ROM), and a compact disk read only memory (CD-ROM), and a storage device such as a hard disk built into a computer system. Further, the "computer-readable recording medium" may also include such a medium that stores programs dynamically for a short period of time, one example of which is a communication line used when a program is transmitted via a network such as the Internet and a communication line such as a telephone line, and may also include such a medium that stores programs for a certain period of time, one example of which is a volatile memory inside a computer system that functions as a server or a client in the above-described case. The above program may be a program for implementing a part of the above-mentioned functions. The above program may be a program capable of implementing the above-mentioned functions in combination with another program already recorded in a computer system. The above program may be a program to be implemented with the use of a programmable logic device such as a field programmable gate array (FPGA).

Although the embodiments of the present invention have been described in detail with reference to the drawings, a specific configuration is not limited to the embodiments, and a design or the like in a range that does not depart from the gist of the present invention is included.

REFERENCE SIGNS LIST 1, 1a, 1b . . . Radio transmission apparatus
10 . . . Information transmitting and receiving unit
11, 11a . . . Selection unit
12, 12a . . . Storage unit
13, 13a, 13b . . . Transmission signal generation unit
14 . . . Radio signal transmitting unit
15-1 to 15-M . . . Transmission antenna
16 . . . Communication distance measurement unit
17 . . . Information transmitting unit
2, 2a . . . Radio reception apparatus
20-1 to 20-N . . . Reception antenna
21-1 to 21-N . . . A/D conversion unit
22 . . . Demodulation unit
23 . . . Estimation unit
24 . . . Information transmitting and receiving unit
25 . . . Information receiving unit
26 . . . Deinterleaving unit
27 . . . Error correcting decoding unit
30 . . . Separation unit
31-1 to 31-L . . . Modulation unit
32, 32a, 32b . . . Multiplexing unit
33-1 to 33-M . . . Error correcting coding unit
34-1 to 34-M . . . Interleaving unit
35-1 to 35-M . . . Modulation processing unit
36-M . . . Separation unit
37-M . . . Combining unit
40-1 to 40-M . . . D/A conversion unit

The invention claimed is:

1. A radio communication system, comprising a radio transmission apparatus including a plurality of transmission antennas and a radio reception apparatus including a plurality of reception antennas,
wherein the radio transmission apparatus includes:
a communication distance measurer configured to measure a distance between the plurality of transmission antennas and the plurality of reception antennas;
a selector configured to select a modulation scheme common to all of a plurality of frequency channels, the modulation scheme satisfying an average value of index values indicating an orthogonality between the plurality of transmission antennas and the plurality of reception antennas for each of the plurality of frequency channels according to the distance between the plurality of transmission antennas and the plurality of reception antennas measured by the communication distance measurer, and satisfying a predetermined desired bit error rate;
a transmission signal generator configured to separate transmission data into a number of all the plurality of frequency channels, modulate each item of the separated transmission data by the selected common modulation scheme, and output a plurality of transmission signals multiplexed by the number of multiplexing indicating the number of the plurality of transmission antennas to be used; and
a radio signal transmitter configured to transmit each of the plurality of transmission signals, and
the radio reception apparatus further includes a demodulator configured to demodulate a reception signal received by each of the plurality of reception antennas by a demodulation scheme corresponding to the modulation scheme to generate reception data,
wherein each of the communication distance measurer, the selector, the transmission signal generator, the radio signal transmitter and the demodulator is implemented by: )
computer executable instructions executed by at least one processor,
ii) at least one circuity or
iii) a combination of computer executable instructions executed by at least one processor and at least one circuity.

2. The radio communication system according to claim 1, wherein the selector selects the modulation scheme common to all the plurality of frequency channels indicating an orthogonality between the plurality of transmission antennas and the plurality of reception antennas, the modulation scheme satisfying an average value of index values for each of the plurality of frequency channels according to the distance between the plurality of transmission antennas and the plurality of reception antennas measured by the communication distance measurer and satisfying a predetermined desired bit error rate, and the selector selects the number of multiplexing.

3. The radio communication system according to claim 1, wherein the transmission signal generator performs error correcting coding or interleaving on the transmission data of one or more frequency channels not satisfying the predetermined desired bit error rate among the plurality of frequency channels, and
the radio reception apparatus performs error correcting decoding corresponding to the error correcting coding when the error correcting coding is performed on the reception data demodulated by the demodulator, and the radio reception apparatus performs deinterleaving corresponding to the interleaving when the interleaving is performed.

4. A radio communication method performed by a radio transmission apparatus including a plurality of transmission antennas and a radio reception apparatus including a plurality of reception antennas, the method comprising:
by the radio transmission apparatus, measuring a distance between the plurality of transmission antennas and the plurality of reception antennas, and selecting a modulation scheme common to all of a plurality of frequency channels, the modulation scheme satisfying an average value of index values indicating an orthogonality between the plurality of transmission antennas and the plurality of reception antennas for each of the plurality of frequency channels according to the measured distance between the plurality of transmission antennas and the plurality of reception antennas and satisfying a predetermined desired bit error rate;

separating transmission data into a number of all the plurality of frequency channels;

modulating each item of the separated transmission data by the selected common modulation scheme; and outputting a plurality of transmission signals multiplexed by the number of multiplexing indicating the number of the plurality of transmission antennas to be used, and transmitting each of the plurality of transmission signals; and demodulating, by the radio reception apparatus, a reception signal received by each of the plurality of reception antennas by a demodulation scheme corresponding to the modulation scheme to generate reception data.

* * * * *